United States Patent
Lee et al.

(10) Patent No.: US 11,695,092 B2
(45) Date of Patent: *Jul. 4, 2023

(54) MICRO LED TRANSFER DEVICE AND MICRO LED TRANSFERRING METHOD USING THE SAME

(71) Applicant: SAMSUNG ELECTRONICS CO., LTD., Suwon-si (KR)

(72) Inventors: Yoonsuk Lee, Suwon-si (KR); Sangmoo Park, Suwon-si (KR); Doyoung Kwag, Suwon-si (KR); Byungchul Kim, Suwon-si (KR); Eunhye Kim, Suwon-si (KR); Minsub Oh, Seoul (KR); Dongyeob Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/674,520

(22) Filed: Feb. 17, 2022

(65) Prior Publication Data

US 2022/0173270 A1 Jun. 2, 2022

Related U.S. Application Data

(63) Continuation of application No. 16/832,884, filed on Mar. 27, 2020, now Pat. No. 11,289,622.

(30) Foreign Application Priority Data

Mar. 27, 2019 (KR) .......................... 10-2019-0035184

(51) Int. Cl.
*H01L 33/00* (2010.01)
*H01L 33/62* (2010.01)

(52) U.S. Cl.
CPC .......... *H01L 33/0095* (2013.01); *H01L 33/62* (2013.01)

(58) Field of Classification Search
None
See application file for complete search history.

(56) References Cited

U.S. PATENT DOCUMENTS

| 4,004,845 A | 1/1977 | Sochor |
| 8,476,826 B2 | 7/2013 | Oohata et al. |
| (Continued) | | |

FOREIGN PATENT DOCUMENTS

| JP | 2010-251360 A | 11/2010 |
| JP | 5196262 B2 | 5/2013 |
| (Continued) | | |

OTHER PUBLICATIONS

International Search Report (PCT/ISA/210) issued by the International Searching Authority in International Application No. PCT/KR2020/002621, dated Jun. 16, 2020.

(Continued)

*Primary Examiner* — Bo B Jang
(74) *Attorney, Agent, or Firm* — Sughrue Mion, PLLC

(57) ABSTRACT

A micro light emitting diode (LED) transfer device includes a transfer part configured to transfer a relay substrate having at least one micro LED; a mask having openings corresponding to a position of the at least one micro LED; a first laser configured to irradiate a first laser light having a first wavelength to the mask; a second laser configured to irradiate a second laser light having a second wavelength different from the first wavelength to the mask; and a processor configured to: control the at least one micro LED to contact a coupling layer of a target substrate, and based on the coupling layer contacting the at least one micro LED, control the first laser to irradiate the first laser light toward (Continued)

the at least one micro LED, and subsequently control the second laser to irradiate the second laser light toward the at least one micro LED.

9 Claims, 24 Drawing Sheets

(56) References Cited

U.S. PATENT DOCUMENTS

| | | | |
|---|---|---|---|
| 9,373,274 | B2 | 6/2016 | Okuyama |
| 10,755,958 | B2 | 8/2020 | Arai |
| 10,770,620 | B2 | 9/2020 | Chen |
| 10,971,890 | B2 | 4/2021 | Zou |
| 2002/0171089 | A1 | 11/2002 | Okuyama |
| 2011/0133216 | A1 | 6/2011 | Sugawara |
| 2017/0162552 | A1 | 6/2017 | Thompson |
| 2017/0288102 | A1 | 10/2017 | Farrens et al. |
| 2018/0069149 | A1 | 3/2018 | Zou et al. |
| 2019/0221466 | A1 | 7/2019 | Arai |
| 2019/0267426 | A1* | 8/2019 | Zou ........................ H01L 27/153 |

FOREIGN PATENT DOCUMENTS

| | | |
|---|---|---|
| JP | 2018-60993 A | 4/2018 |
| KR | 10-2017-0048971 A | 5/2017 |
| KR | 10-2018-0008185 A | 1/2018 |
| KR | 10-2018-0127045 A | 11/2018 |
| KR | 10-2019-0000058 A | 1/2019 |
| WO | 2018/035668 A1 | 3/2018 |

OTHER PUBLICATIONS

Written Opinion (PCT/ISA/237) issued by the International Searching Authority in International Application No. PCT/KR2020/002621, dated Jun. 16, 2020.

* cited by examiner

MICRO LED TRANSFER DEVICE AND MICRO LED TRANSFERRING METHOD USING THE SAME

CROSS-REFERENCE TO RELATED APPLICATION

This application is a Continuation of U.S. application Ser. No. 16/832,884 filed on Mar. 27, 2020, which is based on and claims priority under 35 U.S.C. § 119 to Korean Patent Application No. 10-2019-0035184, filed on Mar. 27, 2019, in the Korean Intellectual Property Office, the disclosures of which are incorporated by reference herein in their entireties.

BACKGROUND

1. Field

The disclosure relates to a micro light emitting diode (LED) transfer device with improved transfer efficiency and a micro LED transferring method using the same.

2. Description of Related Art

A micro LED, which may be a self-light emitting display device, may be a self-illuminating nano-scale inorganic light emitting device, and may refer to a micro LED having a width, a height and a depth in a range of 10 to 100 micrometers (μm). Further, the display device using the micro LED may be manufactured by mounting tens of thousands to hundreds of thousands of nano-scale micro LEDs therein.

The micro LED may be manufactured in chip form on a wafer, and may be included in a light emitting module of a display by being arranged on a target substrate.

A transferring process of disposing a micro LED on a target substrate may include electrically connecting a micro LED to a target substrate while simultaneously disposing the micro LED to a predetermined position at certain intervals, and may be benefitted by a precise disposition and a bonding process.

SUMMARY

Provided are a micro LED transfer device with improved micro LED transfer efficiency and a micro LED transferring method using the same.

Additional aspects will be set forth in part in the description which follows and, in part, will be apparent from the description, or may be learned by practice of the presented embodiments.

In accordance with an aspect of the disclosure, a micro light emitting diode (LED) transfer device includes a transfer part configured to transfer a relay substrate having at least one micro LED arranged at a lower part of the relay substrate; a mask arranged at an upper part of the relay substrate, and having a plurality of openings, wherein a position of the plurality of openings corresponds to a position of the at least one micro LED; a first laser configured to irradiate a first laser light having a first wavelength to the mask; a second laser configured to irradiate a second laser light having a second wavelength different from the first wavelength to the mask; and a processor configured to: control the transfer part to cause the at least one micro LED to contact an upper part of a coupling layer of a target substrate, and based on the coupling layer contacting the at least one micro LED, control the first laser to irradiate the first laser light toward the at least one micro LED, and subsequently control the second laser to irradiate the second laser light toward the at least one micro LED.

The target substrate may include a plurality of connection pads formed at a plurality of predetermined positions, and the processor may be configured to control the transfer part such that a plurality of electrode pads formed on the at least one micro LED are positioned facing the plurality of connection pads.

The processor may be configured to control the transfer part to continuously press the at least one micro LED into the coupling layer based on the first laser light and the second laser light being irradiated toward the at least one micro LED.

The at least one micro LED may be arranged on the relay substrate based on a characteristic information of the at least one micro LED such that output characteristics of a plurality of areas on which the at least micro LED is to be placed are uniform.

The at least one micro LED may include: a first micro LED configured to emit a red light; a second micro LED configured to emit a green light; and a third micro LED configured to emit a blue light, wherein the first micro LED, the second micro LED, and the third micro LED are arranged consecutively on the relay substrate.

The coupling layer may include at least one from among an anisotropic conductive film (ACF) or an anisotropic conductive paste (ACP).

The coupling layer may include a polymer, and a solder paste may be formed on each of the plurality of connection pads.

The micro LED transfer device may further include an adhesive layer arranged between the relay substrate and the at least one micro LED, wherein, based on an area of the adhesive layer being irradiated with the first laser light, the adhesive layer may be configured to separate from a micro LED arranged on the area from among the at least one micro LED.

The first wavelength may include a wavelength in an ultraviolet ray (UV) range, and the second wavelength may include a wavelength in an infrared ray (IR) range.

The coupling layer may be configured to cover a side surface of the at least one micro LED based on the at least one micro LED bonding to the target substrate.

In accordance with an aspect of the disclosure, a micro LED transferring method includes aligning a relay substrate on an upper part of a target substrate; contacting at least one micro LED arranged on the relay substrate with a coupling layer formed on the target substrate; based on the at least one micro LED contacting the coupling layer, irradiating a first laser light toward the at least one micro LED through a mask having a plurality of openings; and based on the at least one micro LED remaining in contact with the coupling layer after the first laser light is irradiated, irradiating a second laser light toward the at least one micro LED through the mask.

The method may further include continuously pressing the at least one micro LED into the coupling layer based on the first laser light and the second laser light being irradiated toward the at least one micro LED.

The at least one micro LED arranged on the relay substrate may be transferred uniformly onto the target substrate.

The method may further include, based on an area of the adhesive layer being irradiated with the first laser light, separating a micro LED arranged on the area from among the at least one micro LED from the adhesive layer.

The at least one micro LED may be arranged on the relay substrate based on a characteristic information of the at least one micro LED such that output characteristics of a plurality of areas on which the at least micro LED is to be placed are uniform.

The aligning of the relay substrate may include aligning a plurality of electrode pads formed on the at least one micro LED to face a plurality of connection pads formed on the target substrate.

The irradiating the second laser may include electrically connecting the plurality of electrode pads with the plurality of connection pads.

The coupling layer may include at least one from among an anisotropic conductive film (ACF) or an anisotropic conductive paste (ACP).

The coupling layer may include a polymer, and a solder paste may be formed on each of the plurality of connection pads.

In accordance with an aspect of the disclosure, a non-transitory computer readable recording medium may be configured to store instructions which, when executed by at least one processor, cause the at least one processor to execute a micro LED transferring method including: aligning a relay substrate at an upper part of a target substrate; contacting at least one micro LED arranged on the relay substrate with a coupling layer formed on the target substrate; based on the at least one micro LED contacting the coupling layer, irradiating a first laser light toward the at least one micro LED through a mask having a plurality of openings; and based on the at least one micro LED remaining in contact with the coupling layer after the first laser light is irradiated, irradiating a second laser light toward the at least one micro LED through the mask.

In accordance with an aspect of the disclosure, a micro light emitting diode (LED) transfer device includes a relay substrate; an adhesive layer arranged at a lower part of the relay substrate and configured to secure a micro LED against the lower part of the relay substrate; a mask arranged at an upper part of the relay substrate and having an opening corresponding to the micro LED; a first laser configured to irradiate a first laser light having a first wavelength to the mask; a second laser configured to irradiate a second laser light having a second wavelength different from the first wavelength to the mask; and a processor configured to: control the relay substrate to press the micro LED against a coupling layer of a target substrate, control the first laser to release the micro LED from the adhesive layer by irradiating the first laser light through the hole, and control the second laser to bond the released micro LED to the coupling layer by irradiating the second laser light through the hole.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Embodiments may be described with reference to the accompanying drawings in order to sufficiently understand the configuration and effect of the disclosure. However, the disclosure is not limited to the embodiments disclosed herein, and may be implemented in various forms and various modification may be made thereto. Descriptions of the embodiments are provided to augment the disclosure, and to enable those of ordinary skill in the technical field to which the disclosure pertains to fully understand the scope. Elements in the enclosed drawings have been illustrated and enlarged in size compared to actual size for convenience of description, and the ratio of each element may be exaggerated or minimized.

In the disclosure, when a certain element is disclosed as being "on" or "connected to" another element, this may not only indicate being directly in contact with or connected to another element but also other element may be present therebetween. On the other hand, when a certain element is disclosed as being "directly on" or "directly connected to" another element, it may be understood as there being no other element present therebetween. Other expressions describing the relationship between elements, such as, " . . . between" and "directly . . . between" may also be interpreted in the same manner.

Terms such as first and second may be used to describe various elements, but the terms should not be understood as limiting the corresponding elements. The terms may be used to distinguish one element from another element. For example, a first element may be designated as a second element, and likewise, a second element may be designated as a first element without departing from the claimed scope.

A singular expression may include a plural expression, unless otherwise specified. It is to be understood that the terms such as "comprise" or "consist of" are used herein to designate a presence of a characteristic, number, step, operation, element, component, or a combination thereof, and that one or more of another characteristic, number, step, operation, element, component, or a combination thereof may be added.

The terms used in the embodiments may be interpreted in the commonly known meaning to those of ordinary skill in the relevant technical field, unless otherwise specified.

An example of a micro LED transfer device 1 according to an embodiment will be described below with reference to FIGS. 1 to 2.

Figure 1:
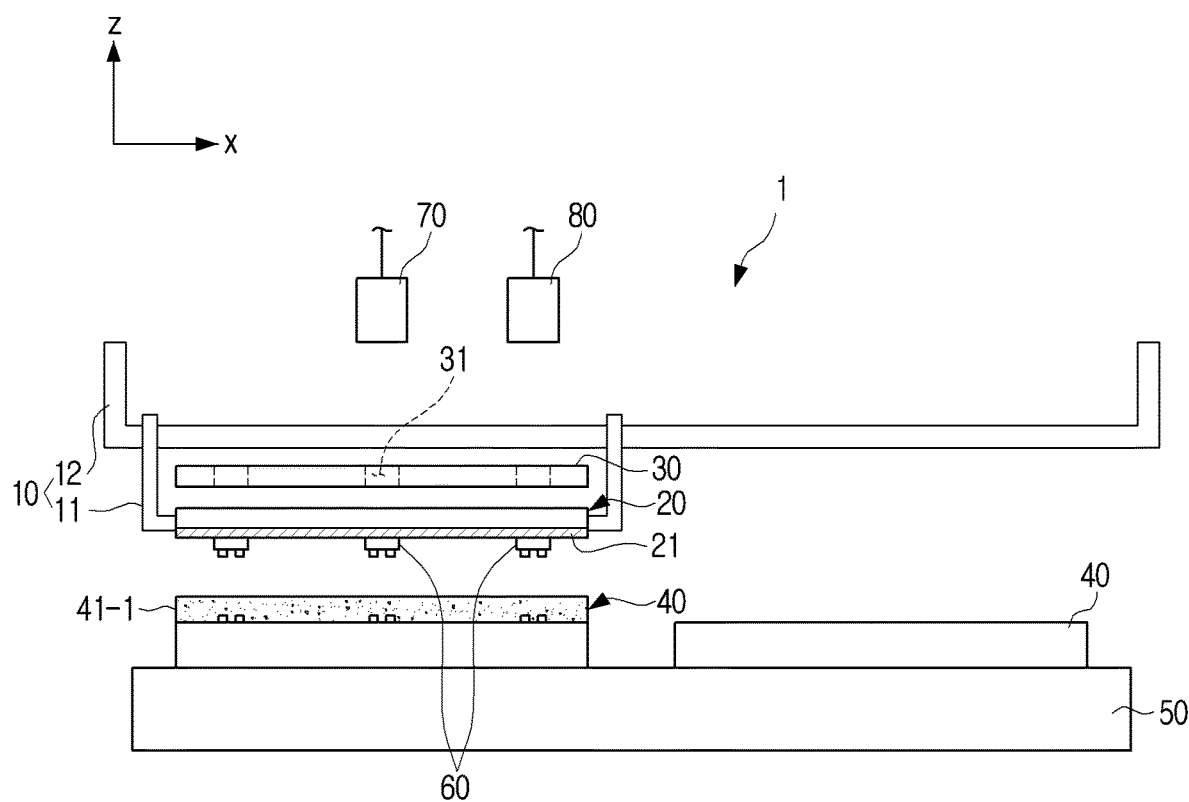
FIG. 1 is a schematic diagram illustrating a micro LED transfer device according to an embodiment.
Figure 2:
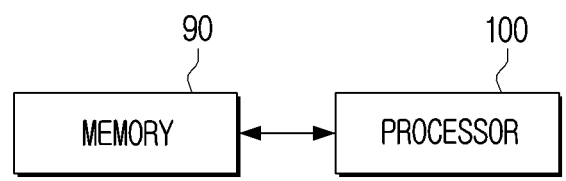
FIG. 2 is a block diagram illustrating a memory and a processor according to an embodiment.

FIG. 1 is a schematic diagram illustrating a micro LED transfer device 1 according to an embodiment, and FIG. 2 is a block diagram illustrating a memory 90 and a processor 100 according to an embodiment.

The micro LED transfer device 1 may be a device that irradiates at least one micro LED 60 on a target substrate 40. The micro LED transfer device 1 may include a transfer part 10 configured to transfer a relay substrate 20 with at least one micro LED 60 arranged at a lower part, a mask 30 arranged at an upper part of the relay substrate 20 and formed with a plurality of openings 31 corresponding to a position of each of the at least one micro LED 60, a first laser 70 configured to irradiate a first laser light to the mask 30, and a processor 100 configured to control the transfer part 10 to enable at least one micro LED 60 to contact an upper part of a coupling layer 41-1 of a target substrate 40, and based on the coupling layer 41-1 being in contact with at least one micro LED 60, control the first laser 70 to enable the first laser light to irradiate toward the at least one micro LED 60.

The transfer part 10 may include a fixing member 11 connected to a relay substrate 20 capable of moving the relay substrate 20 and a guiding member 12 connected to the fixing member capable of guiding the movement of the fixing member 11.

Further, the transfer part 10 may move the relay substrate 20 on the target substrate 40 along a space coordinate system, for example, an X-axis, Y-axis and Z-axis, vertically and horizontally, and also rotate about an X-axis, a Y-axis and a Z-axis.

Accordingly, the transfer part 10 may be moved to various positions of a plurality of target substrates 40 on a stage 50 based on the relay substrate 20 being in a fixed state.

The fixing member 11 is illustrated as fixing the edge area of the relay substrate 20, but is not limited thereto, and may be configured to various structures based being connected to various parts of the relay substrate 20 and stably fixing the relay substrate 20 thereto.

The guiding member 12 may be arranged at an upper part of the target substrate 40, and move the fixing member 11 connected to the relay substrate 20 onto the target substrate 40. The guiding member 12 may be coupled to a structure as desired.

Further, the guiding member 12 may move the fixing member 11 through various structures such as a multi-joint structure, a piston structure, a sliding structure, or the like. In addition, the guiding member 12 itself may be moved if necessary.

Accordingly, the transfer part 10 may align the relay substrate 20 relative to the target substrate 40 for the relay substrate 20 and the target substrate 40 to correspond.

Specifically, the transfer part 10 may move the relay substrate 20 for each of the at least one micro LED 60 and each of a plurality of connection pads 48 formed on the target substrate 40 to face each other.

Figure 3A:
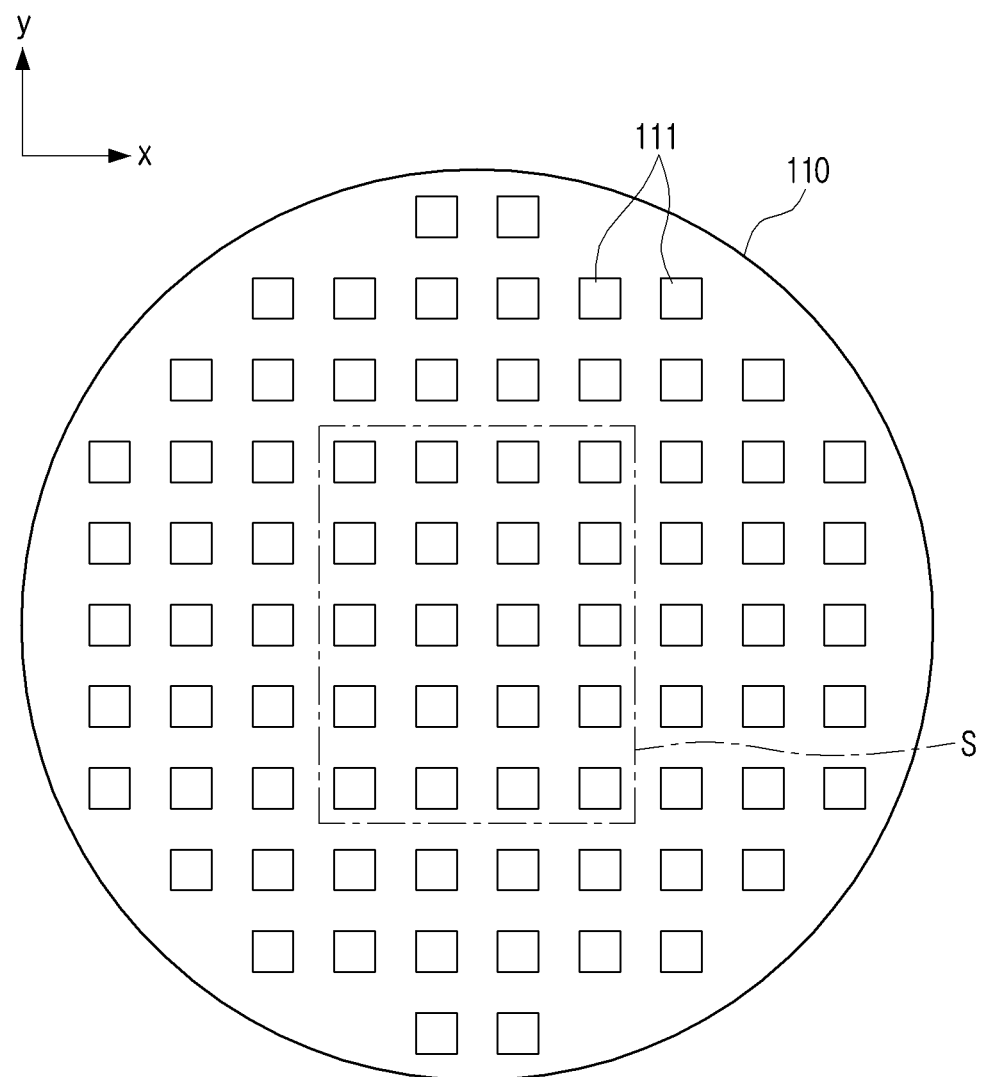
FIG. 3A is a top view illustrating a wafer.

The relay substrate 20 may be arranged with at least one micro LED 60 manufactured on a wafer 110, an example of which may be shown in FIG. 3A, based on characteristic information of at least one micro LED 60 such that an output characteristic between a plurality of areas may be uniform.

That is, the at least one micro LED 60 manufactured on the wafer 110 may be rearranged on the relay substrate 20 considering the output characteristic of each of the at least one micro LED 60.

An example of a rearranged arrangement structure of the at least one micro LED 60 arranged on the relay substrate 20 will be described below with reference to FIGS. 3A and 5D.

Further, the relay substrate 20 may be bigger than the size of the wafer 110, and correspond to the size of the target substrate 40. Accordingly, based on the at least one micro LED 60 arranged on the relay substrate 20 being uniformly irradiated on the target substrate 40, a manufacturing time and a number of processes of the target substrate 40 applied to a product may be reduced.

In addition, the relay substrate 20 may include an adhesive layer 21 arranged between one surface of the relay substrate 20 and at least one micro LED 60.

The adhesive layer 21 adheres the at least one micro LED 60 and the relay substrate 20, and may be configured as a polymer having adhesive property. For example, the adhesive layer 21 may be configured as a polyamide (PI).

Further, the adhesive layer 21 may include a material that loses adhesive property in areas irradiated with a laser of a specific wavelength range. For example, an irradiation area 21-1, an example of which may be illustrated in FIG. 9, irradiated with a first laser light 70-L of a first wavelength of the adhesive layer 21 loses adhesive property, and the micro LED 60 arranged on the irradiation area 21-1 may separate from the relay substrate 20.

Specifically, in an embodiment the adhesive layer 21 reacts and loses adhesive property only to a first laser light 70-L having a first wavelength of an ultraviolet ray (UV) range, and does not react to a laser light of a different wavelength range.

For example, the first wavelength may be 10 nm to 400 nm. More specifically, the first wavelength may be 248 nm to 345 nm.

Accordingly, the adhesive layer 21 may, based on selectively irradiating the first laser light 70-L having a first wavelength to a predetermined position, separate only the micro LED 60 positioned in an irradiation area 21-1 of the at least one micro LED 60 arranged on the adhesive layer 21 from the relay substrate 20.

Figure 10A:
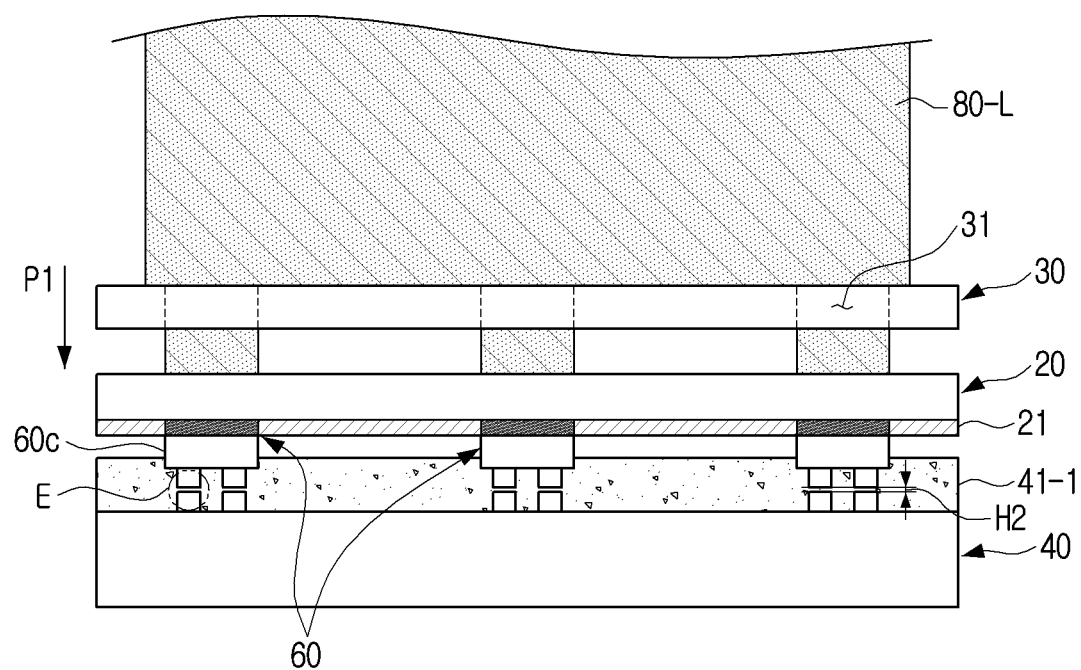
FIG. 10A is a side view illustrating a second laser light being irradiated.

The mask 30 may be arranged on the relay substrate 20, and pass the first laser light 70-L being emitted from the first laser 70 and the second laser light 80-L, an example of which may be illustrated in FIG. 10A, being emitted from the second laser 80 through the plurality of openings 31 formed on the mask 30 onto the relay substrate 20.

Specifically, the plurality of openings 31 may be formed at a position corresponding to a position of each of the at least one micro LED 60.

Accordingly, the plurality of openings 31 may selectively irradiate the first laser light 70-L and the second laser light 80-L only to a position arranged with at least one micro LED 60.

Further, the mask 30 may be configured in a material incapable of passing the laser light, and may have heat resistance for durability against the laser light. Further, the upper part of the mask 30 may be applied with heat resistant material to raise heat resistance to laser light.

Accordingly, the mask 30 may irradiate laser light to the relay substrate 20 through only the plurality of openings 31.

In addition, the mask 30 may move onto the relay substrate 20 by the processor 100. Accordingly, the mask 30 may align the plurality of openings 31 with the arranged position of the at least one micro LED 60. Further, based on requiring a substitution of the mask 30, the mask 30 may be substituted to a new mask.

The target substrate 40 may fix the at least one micro LED 60 transferred onto the target substrate 40 and concurrently operate the at least one micro LED 60. For example, the target substrate 40 may include a thin film transistor layer including a thin film transistor (TFT).

That is, the target substrate 40 may form an image on the display through the operation of at least one micro LED 60.

In this case, the display module according to the disclosure may be applied to a wearable device, a portable device, a handheld device as a single unit and to electronic products or electric field products that require various displays. In addition, the display module may be a matrix type applicable to a display device such as a personal computer monitor, a high-resolution TV, a signage, and an electronic display through a plurality of assembly arrangements.

The target substrate 40 may be configured to various sizes according to the size to be used in products.

An example of a specific structure of the target substrate 40 will be described in greater detail below with reference to FIG. 6.

The micro LED 60 may be configured as one of a plurality of micro LEDs, and fixed to the lower part of the relay substrate 20 through the adhesive layer 21.

The micro LED 60 may consist of an inorganic light emitting material with a width, height and depth of 100 μm or less, may irradiate light by itself based on power being supplied.

Further, the micro LED 60 may be attracting attention as the light emitting device of a next generation display having a fast reaction speed, low power consumption, and high brightness. Specifically, the micro LED 60 may be more efficient than existing LCDs or OLEDs in converting electricity into photons.

That is, the micro LED may have a higher "brightness per watt" than existing LCD or OLED displays. As an example, the micro LED 60 may produce the same brightness with only half the energy compared to existing LEDs or OLEDs.

In addition, the micro LED 60 may express a wide range of colors clearly for being able of exhibit high resolution, superior color, contrast and brightness, and may form a clear screen even in a bright sunny outdoor environment.

The first laser 70 may emit the first laser light 70-L for lifting-off the at least one micro LED 60 arranged at a lower part of the relay substrate 20.

The first laser 70 may be arranged on the upper part of the relay substrate 20 and may either directly irradiate the first laser light 70-L toward the upper part of the relay substrate 20 or members such as a P-lens may be introduced in a path of the first laser light 70-L and change the directionality of the light.

That is, the first laser 70, based on the first laser light 70-L being irradiated at the upper part of the relay substrate 20, may be arranged at various positions of the micro LED transfer device 1.

Further, the first laser 70 may emit laser lights of various types such as a spot laser or a line laser.

In addition, the first laser 70 may irradiate the first laser light 70-L of the first wavelength capable of reacting with the adhesive layer 21 of the relay substrate 20. The first wavelength, as a wavelength range that removes adhesive property in the adhesive layer 21 by reacting with the adhesive layer 21, may be a wavelength range with which the adhesive layer 21 reacts.

Accordingly, the first laser light 70-L of the first wavelength may lift-off the at least one micro LED 60 from the relay substrate 20. That is, the first laser light 70-L of the first wavelength may separate the at least one micro LED 60 from the relay substrate 20.

Further, the micro LED transfer device 1 may include a second laser 80 that irradiates a second laser light 80-L of a second wavelength different from the first wave length of the first laser light 70-L to the mask 30.

The second laser 80 may be arranged at the upper part of the relay substrate 20 and may directly irradiate the second laser light 80-L toward the upper part of the relay substrate 20, or members such as a P-lens may be introduced to the path of the second laser light 80-L and change the directionality of the light.

That is, the second laser 80, based on the second laser light 80-L being irradiated at the upper part of the relay substrate 20, may be arranged at various positions of the micro LED transfer device 1.

Further, the second laser 80 may emit laser lights of various types such as a spot laser or a line laser.

In addition, the second laser 80 may irradiate the second laser light 80-L of the second wavelength, which is capable of bonding the at least one micro LED 60 on the target substrate 40.

For example, based on the second laser light 80-L being irradiated on the relay substrate 20, the heat of the second laser light 80-L may be transferred to the coupling layers 41-2 and 41-2 formed on the target substrate 40 through the at least one micro LED 60.

Accordingly, the viscosity of a part of the area of the coupling layers 41-1 and 41-2 contacting the at least one micro LED 60 may be changed, and the at least one micro LED 60 may be moved and arranged to be adjacent to the plurality of connection pads 48 of the target substrate 40.

That is, the viscosity of a part of the area of the coupling layers 41-1 and 41-2 contacting the at least one micro LED 60 may be changed. The viscosity changing may refer to a distance between molecules and arrangement of the coupling layers 41-1 and 41-2 changing.

The second laser light 80-L of the second wavelength may then allow the at least one micro LED 60 to be connected to the target substrate 40 electrically and physically.

The second wavelength may be different from the first wavelength, and may be a wavelength range that does not react with the adhesive layer 21 unlike the first wavelength. For example, the second wavelength may be a wavelength of an infrared ray (IR) range. Specifically, the second wavelength may be from 750 nm to 1 mm and more specifically, the second wavelength may be 980 nm.

That is, the first laser light 70-L of the first wavelength may separate the at least one micro LED 60 from the relay substrate 20, and the second laser light 80-L of the second wavelength may connect the at least one micro LED 60 to the target substrate 40.

Referring to FIG. 2, the memory 90 may store characteristic information of each of the at least one micro LED 60, and the processor may control the overall operation of the micro LED transfer device 1 that includes the transfer part 10, the mask 30, the first laser 70, and the second laser 80.

The memory 90 may be included in the micro LED transfer device 1. Further, the memory may be implemented to at least one of a flash memory type, a read only memory (ROM), a random access memory (RAM), a hard disk type, a multimedia card micro type, a memory of a card type, for example, SD or XD memory, etc.

Further, as illustrated in FIG. 2, the memory 90 may be electrically connected to the processor 100 and may transmit signals and information therebetween. Accordingly, the memory 90 may store characteristic information of the input or irradiated at least one micro LED 60 and transmit the stored characteristic information stored to the processor 100.

The processor 100 may be included in the micro LED transfer device 1, and control the overall operation of the micro LED transfer device 1. Further, the processor 100 may perform a function of controlling the overall operation of the micro LED transfer device 1.

For example, the processor 100 may control the transfer part 10 for the at least one micro LED 60 to contact the upper part of the coupling layer 41-1 of the target substrate 40.

In addition, the processor 100 may control the first laser 70 to irradiate the first laser light 70-L toward the at least one micro LED 60 based on the coupling layer 41-1 being in contact with the at least one micro LED 60.

Further, the processor 100 may, based on the coupling layer 41-1 being in contact with the at least one micro LED 60, control the second laser 80 to consecutively irradiate the second laser light 80-L toward the at least one micro LED 60 after irradiating the first laser light 70-L.

The disclosure is not limited to all configurations being controlled by one processor 100, but may control each configuration using multiple independent processors.

The processor 100 may include one or more of a central processing unit (CPU), a controller, an application processor (AP), a communication processor (CP), or an ARM processor.

Further, the processor may be electrically connected to the memory 90 and use the characteristic information of the at least one micro LED 60 stored in the memory 90.

An example of a rearrangement process and structure of at least one micro LED 60 arranged on a relay substrate 20 according to an embodiment will be described in greater detail below with reference to FIGS. 3A to 5B.

Figure 3B:
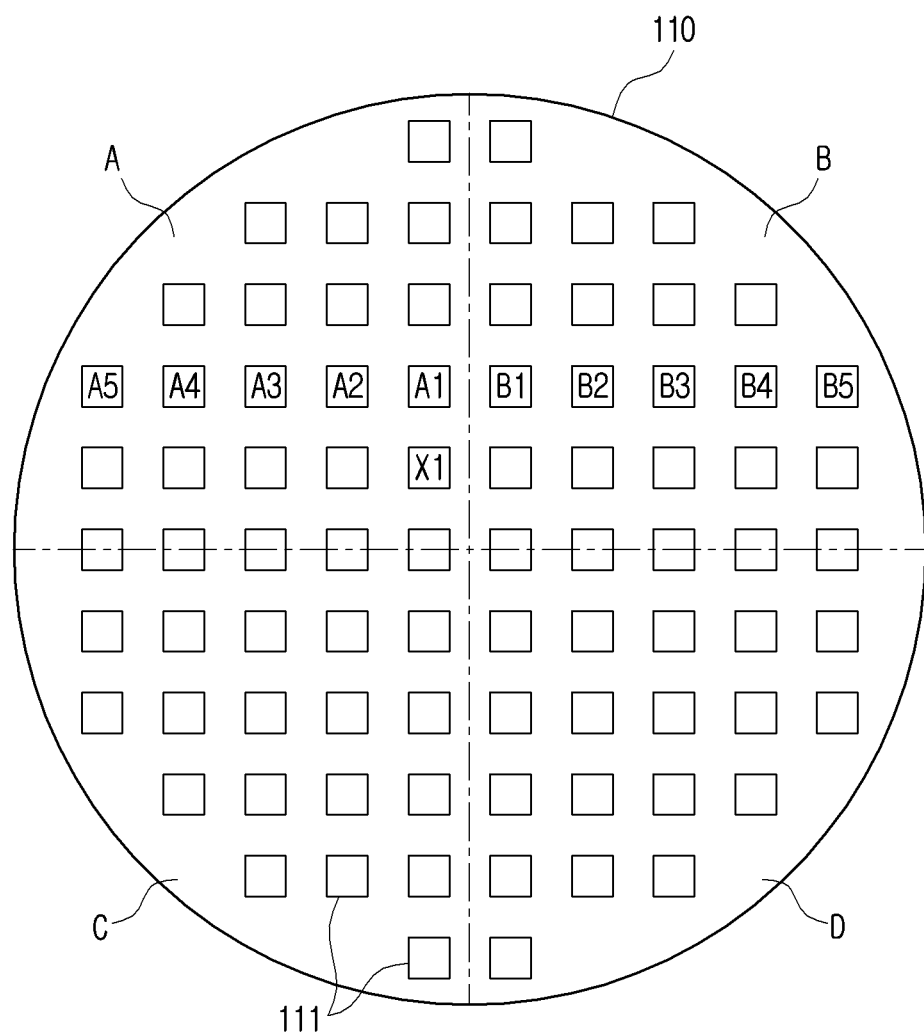
FIG. 3B is a top view illustrating characteristic information of a manufactured micro LED of FIG. 3A.
Figure 4:
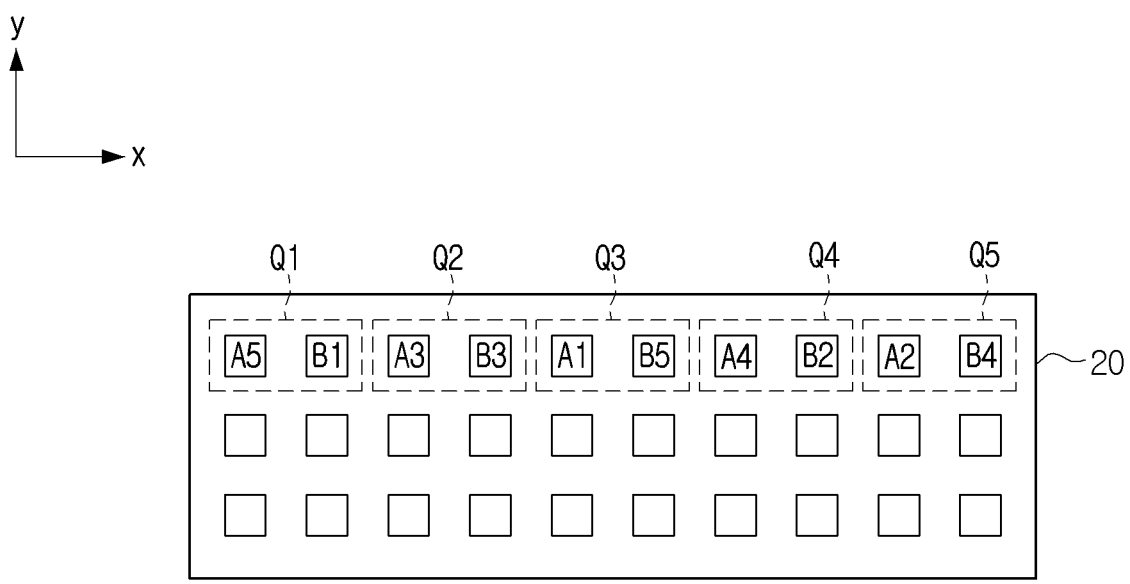
FIG. 4 is a bottom view illustrating characteristic information of a part of a micro LED arranged on a relay substrate according to an embodiment.
Figure 5A:
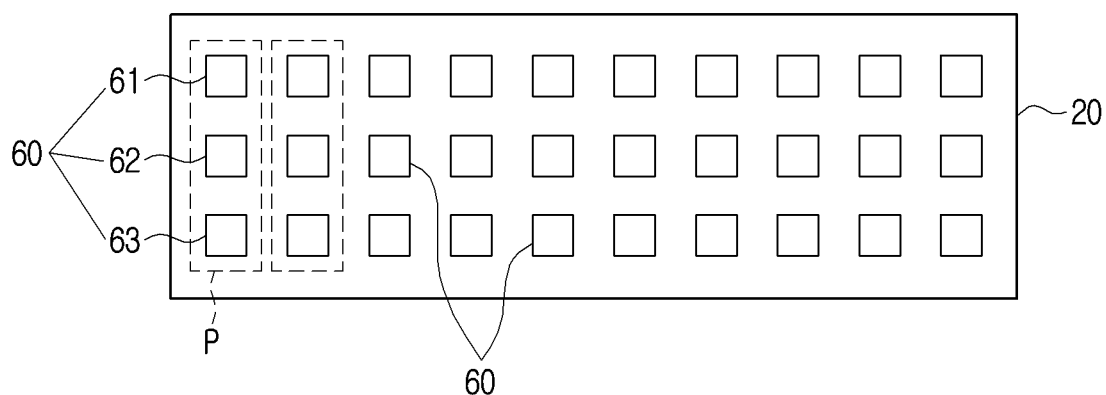
FIG. 5A is a bottom view illustrating a micro LED arranged on a relay substrate according to an embodiment.
Figure 5B:
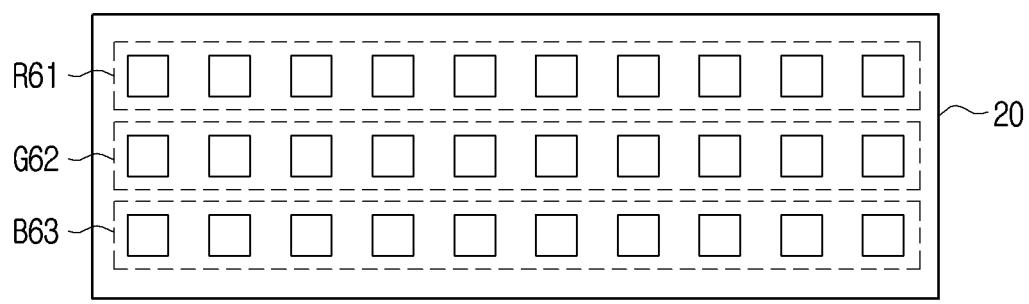
FIG. 5B is a bottom view illustrating a micro LED arranged on a relay substrate according to an embodiment.

FIG. 3A is a top view illustrating a wafer 110, FIG. 3B is a top view illustrating characteristic information of a manufactured micro LED 111 of FIG. 3A, FIG. 4 is a bottom view illustrating characteristic information of a part of a micro LED 60 arranged on a relay substrate 20 according to an embodiment, FIG. 5A is a bottom view illustrating a micro LED 60 arranged on a relay substrate 20 according to an embodiment, and FIG. 5B is a bottom view illustrating a micro LED 60 arranged on a relay substrate 20 according to an embodiment.

As illustrated in FIG. 3A, the wafer 110 may be arranged with a plurality of manufactured micro LEDs 111. The number of the at least one micro LED 111 arranged on the wafer 110 is illustrated for convenience of description, and the disclosure is not limited to the number and size formed in FIG. 3A.

Further, the manufactured micro LED 111 may refer to the micro LED in a manufactured state on the wafer 110, and the micro LED 60 on the relay substrate 20 may refer to the micro LED 60 of a rearranged state based on characteristic information of the manufactured micro LED 111.

The plurality of manufactured micro LEDs 111 may have good characteristics in a specific area S on the relay substrate 20 due to manufacturing tolerance in the manufacturing process. Specifically, the characteristic of the micro LED positioned within a specific area S on the wafer 110 may be better or more desirable than the characteristic of the plurality of manufactured micro LED 111 positioned in an area other than the specific area S of the wafer 110.

The characteristics of the plurality of manufactured micro LEDs 111 may be at least one of an output wavelength, brightness, or performance rating.

Specifically, the output wavelength may relate to a color emitted and shown by the manufactured micro LED 111, and the color shown by the manufactured micro LED 111 may change according to the output wavelength.

For example, the manufactured micro LED 111 may show a red color based on emitting light in the wavelength range of approximately 630 nm to 780 nm, a green color based on emitting light in the wavelength range of approximately 520 nm to 570 nm, and a blue color based on emitting light in the wavelength range of approximately 420 nm to 480 nm.

More specifically, even when a micro LED showing a green light in the wavelength range of approximately 520 nm to 570 nm is arranged on the relay substrate 20, the wavelength range close to approximately 520 nm may show a blue green color, and the wavelength range close to approximately 570 nm may show a yellow green color.

Accordingly, the characteristic of the manufactured micro LED 111 may change according to the output wavelength emitted by the manufactured micro LED 111.

In addition, the brightness may indicate the brightness of a light source having a certain range and the brightness shown by the plurality of manufactured micro LEDs 111 according to the brightness of the plurality of manufactured micro LEDs 111 arranged on the wafer 110 may change.

Further, the performance rating may refer to dividing the output wavelength or brightness according to a specific standard and the specific standard may be varied according to a need of a user.

For example, based on the performance rating being based on output wavelength, the performance rating may be set to a high performance rating the closer to the wavelength of the specific standard, and the performance rating may be set to a low performance rating the farther from the wavelength of the specific standard.

In addition, based on the performance rating being based on brightness, the performance rating may be set to a high performance rating the higher the brightness, the performance rating may be set to a low performance rating the lower the brightness.

Further, the performance rating may consider both the output wavelength and the brightness according to an arbitrary standard of a user. For example, the performance rating may be set giving a weighted value of U/100, where U refers to a natural number of 100 or less, to the output wavelength and a weighted value of (100−U)/100 to the brightness according to the characteristics the user wishes to implement in the manufactured micro LED 111.

Referring to FIG. 3B, the characteristic of the plurality of manufactured micro LEDs 111 may be measured by using an external measuring device on the plurality of manufactured micro LEDs 111 arranged on the wafer 110. The measured characteristic information may then be stored in the memory 90.

The processor 100 may use the characteristic information stored in the memory 90 and determine the performance rating for each of the plurality of manufactured micro LEDs 111 arranged on the wafer 110.

In addition, the processor 100 may, based on the characteristic information stored in the memory 90 and the determined performance rating, divide the wafer 110 to a plurality of areas, for example areas A, B, C, and D.

For example, the micro LED having a first-grade rating in performance within an area A of the relay substrate 20 may be referred to as A1-micro LED and the chip having a fifth-grade rating in performance within the area A may be referred to as A5-micro LED.

Likewise, a chip having a first-grade rating in performance within an area B of the wafer 110 may be referred to as B1-micro LED and the chip having a fifth-grade rating in performance within an area B may be referred to as B5-micro LED.

Further, the processor 100 may divide the relay substrate 20 to a plurality of areas, for example areas Q3 to Q5, referring to FIG. 4, and determine the arrangement position of each of the plurality of manufactured micro LED 111 for the output characteristic feature between the plurality of areas Q3 to Q5 included in the relay substrate 20 to be uniform.

The arrangement position may refer to the position the plurality of manufactured micro LEDs 111 are arranged on the relay substrate 20, and may refer to an order the plurality of manufactured micro LEDs 111 are rearranged.

Specifically, the processor 100 may divide the wafer 110 and each of the relay substrates 20 to a plurality of areas, for example areas A, B, C, and D of the wafer 110 and areas Q3 to Q5 of the relay substrate 20, and determine the arrangement position of each of the plurality of manufactured micro LED 111 for the output characteristic between the plurality of areas Q3 to Q5 included in the relay substrate 20 to be uniform, and for the at least one micro LED within different areas A, B, C, and D of the wafer 110 in a one area Q3, Q4, Q5 of the relay substrate 20 to be arranged.

For example, referring to FIG. 4, the arrangement position of the plurality of manufactured micro LED 111 may be determined for the average value of the performance rating of A5-micro LED and B1-micro LED included in a first area Q1 on the relay substrate 20 to be 3, the average value of the performance rating of A3-micro LED and B3-micro LED included in a second area Q2 to be 3, and the average value of the performance rating of A1-micro LED and B4-micro LED included in a third area Q3 to be 3.

The output characteristic may correspond to any one of the output wavelength, brightness, and performance rating consisting the characteristic information.

Further, the specific area, for example Q1 to Q3, may be an arbitrary area, and may be of various shape, range, and width according to user selection.

In addition, the average value and standard deviation between specific areas, for example Q1 to Q3. disclosed herein are merely an example for determining whether the performance rating of the plurality of manufactured micro LEDs 111 mounted on the relay substrate 20 has even distribution.

Accordingly, in order for the performance rating of the plurality of manufactured micro LEDs 111 to determine even distribution, an arithmetic method measuring various distribution for use in statistics such as the average value and standard deviation of a specific area Q1 to Q3, but also distribution and dispersion may be used.

Further, the disclosure is not limited to evaluating the performance rating of all manufactured micro LEDs 111 included in the specific area, and may produce a sample of the at least one micro LED included in a specific area and determine the distribution of each performance rating.

Accordingly, the plurality of manufactured micro LEDs 111 on the wafer 110 may be arranged on the relay substrate 20 for the output characteristic between the plurality of areas to be uniform based on characteristic information of the plurality of manufactured micro LEDs 111.

Accordingly, based on selectively irradiating the micro LED required in various areas of the plurality of manufactured micro LEDs 111 that show a performance difference in the wafer 110 onto the relay substrate 20, manufacturing costs may be reduced by improving irradiation efficiency and efficiently using the plurality of manufactured micro LEDs 111.

As illustrated in FIG. 5A, based on a rearrangement of the plurality of manufactured micro LEDs 111 on the wafer 110, at least one micro LED 60 may then be arranged on the relay substrate 20.

For convenience of description, a plurality of electrode pads 68 in the at least one micro LED 60 is not illustrated in FIGS. 5A to 5D Based on the at least one micro LED 60 being configured in plurality, the micro LED 60 may include a first micro LED 61 emitting a red color light, a second micro LED 62 emitting a green color light, and a third micro LED 63 emitting a blue color light, and the first to third micro LEDs 61, 62 and 63 may be consecutively arranged on the relay substrate 20.

That is, the first to third micro LEDs 61, 62 and 63 may constitute one pixel P. Specifically, the first to third micro LEDs 61, 62 and 63 may be arranged in a column on the relay substrate 20 to constitute one pixel P.

In addition, as illustrated in FIG. 5B, a plurality of first micro LEDs R61 emitting a red color light may be arranged in a first row, a plurality of second micro LEDs G62 emitting a green color light may be arranged in a second row, and a plurality of third micro LEDs B63 emitting a blue color light may be arranged in a third row of the relay substrate 20.

The micro LEDs arranged at each of the rows may be arranged for the output characteristic to be uniform based on characteristic information of the micro LED on the wafer 110 manufactured in a single color.

Accordingly, the micro LED 60 arranged on the relay substrate 20 may be in a state in which the output characteristic is uniformly arranged on the relay substrate 20. Thereby, based on the at least one micro LED 60 on the relay substrate 20 being uniformly irradiated on the target substrate 40 applicable to a product, a uniform brightness and color of the target substrate 40 may be realized.

Further, a process of additionally rearranging the at least one micro LED 60 may be reduced for a uniform brightness on the target substrate 40.

An example of at least one micro LED 60 arranged on a relay substrate 20' according to an embodiment will be described below with reference to FIG. 5C.

Figure 5C:
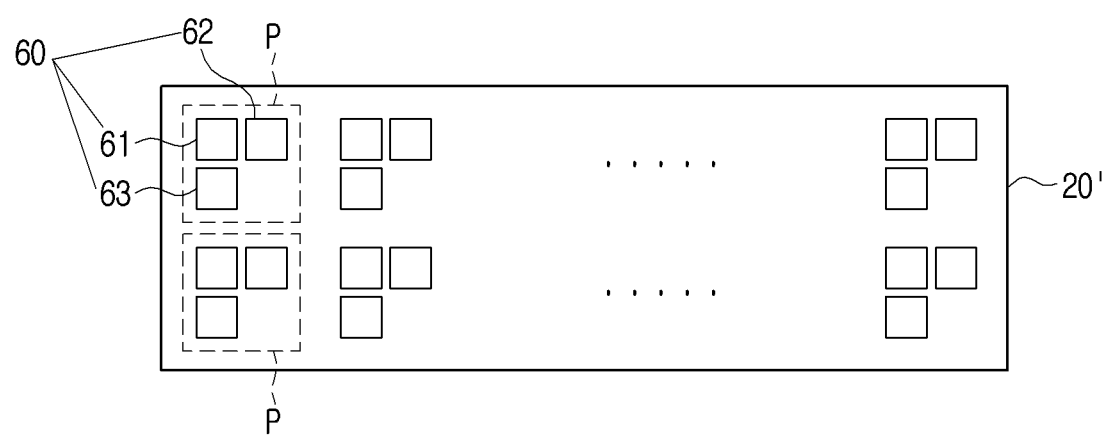
FIG. 5C is a bottom view illustrating a micro LED arranged on a relay substrate according to a modified embodiment.

FIG. 5C is a bottom view illustrating a micro LED 60 arranged on a relay substrate 20' according to an embodiment. The same reference numeral has been used in the first micro LED 61, the second micro LED 62, and the third micro LED 63, which are of the same configuration, and repetitive descriptions have been omitted.

The first to third micro LEDs 61, 62 and 63 of the at least one micro LED 60 may be sufficient if one pixel P may be constituted, and may be variously arranged.

For example, as illustrated in FIG. 5C, the first to third micro LEDs 61, 62 and 63 may be arranged in a '¬' character (arranged in a bent shape) shape on the relay substrate 20'.

Accordingly, in the at least one micro LED 60, one pixel P may be one unit and a plurality of pixels P may be arranged on the relay substrate 20'. The distance between a center of the plurality of pixels P may be equal.

That is, the one pixel P may be sufficient based on being configured with the first to third micro LEDs 61, 62 and 63, and the arrangement structure of the first to third micro LEDs 61, 62 and 63 within the one pixel P may be varied.

For example, the first to third micro LEDs 61, 62 and 63 may be arranged to run alongside horizontally or arranged to run alongside vertically, or arranged in a bent shape, or the like, and may be variously arranged according to necessity.

An example of a structure of the relay substrate 20" according to another embodiment will be described below with reference to FIG. 5D.

Figure 5D:
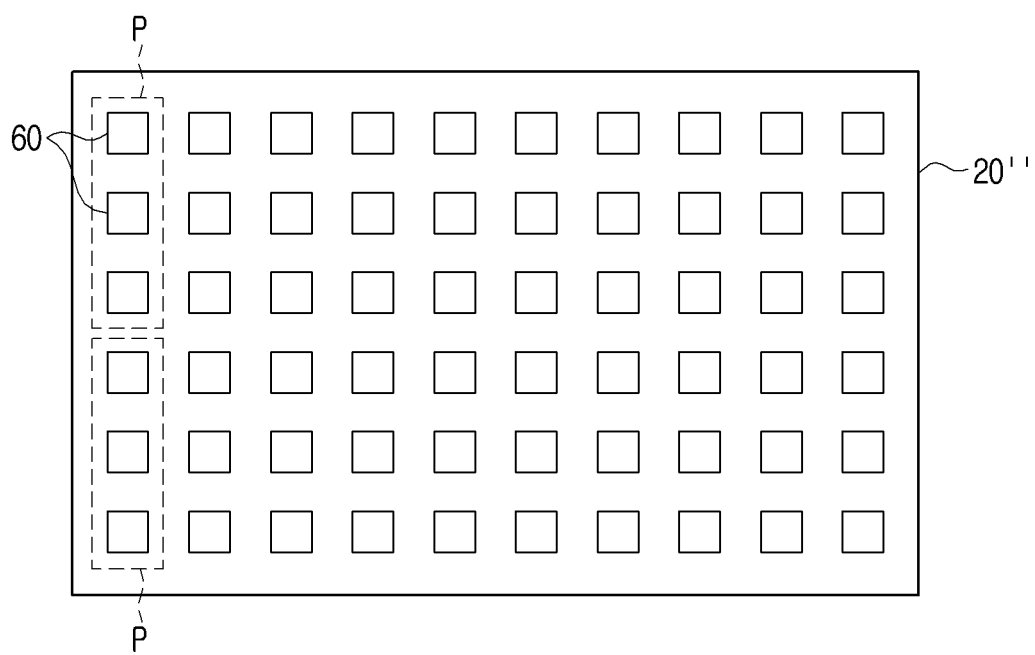
FIG. 5D is a bottom view illustrating a micro LED arranged on a relay substrate according to another modified embodiment.

FIG. 5D is a bottom view illustrating a micro LED 60 arranged on a relay substrate 20" according to another embodiment.

As illustrated in FIG. 5D, the size of the relay substrate 20" may be provided into various sizes to correspond to the target substrate 40. For example, the relay substrate 20" may be provided into sizes capable of accommodating a number of micro LEDs 60 to uniformly irradiate the target substrate 40.

Accordingly, the at least one micro LED 60 adhered to the relay substrate 20" may be uniformly irradiated onto the target substrate 40 through a one-time transfer process. Therefore, the number of transfers to the target substrate 40 may be reduced by determining the size of the relay substrate 20" according to the size of the target substrate 40 required by the at least one micro LED 60 of a predetermined number.

An example of an irradiation process of a micro LED according to an embodiment will be described in greater detail below with reference to FIGS. 6 to 11B.

Figure 6:
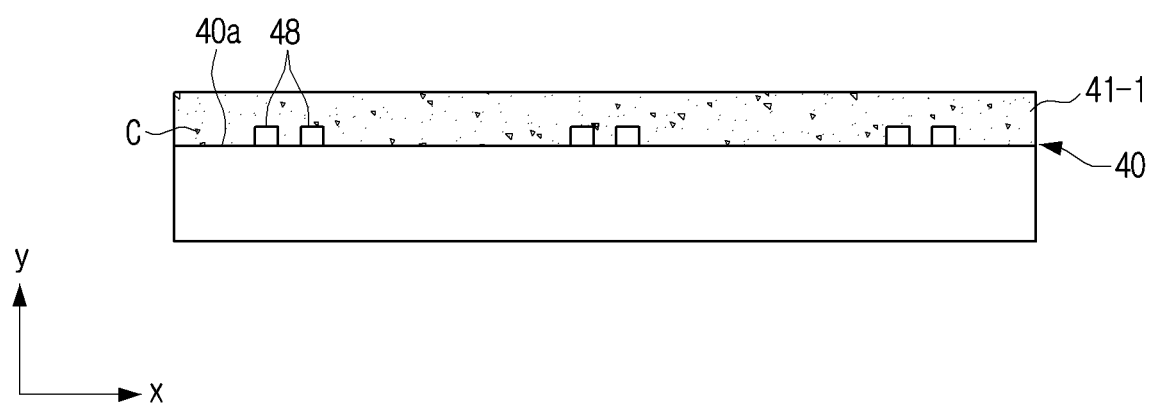
FIG. 6 is a side view illustrating a target substrate according to an embodiment.
Figure 7:
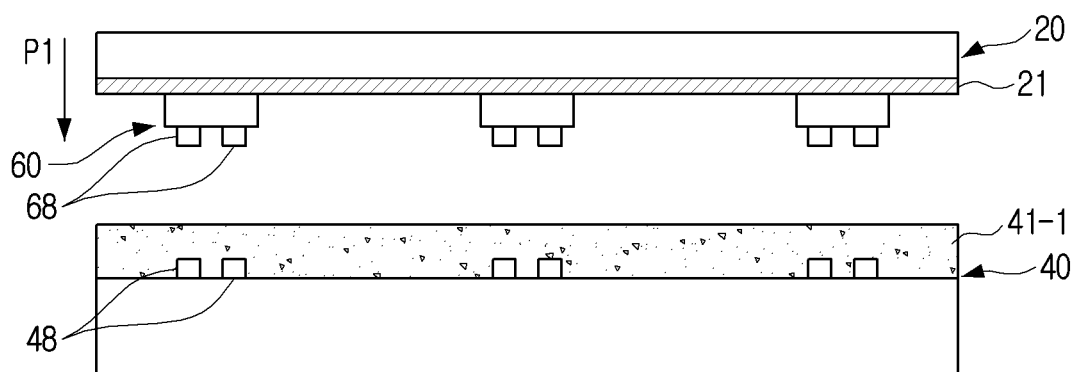
FIG. 7 is a side view illustrating a relay substrate arranged on a target substrate according to an embodiment.
Figure 8:
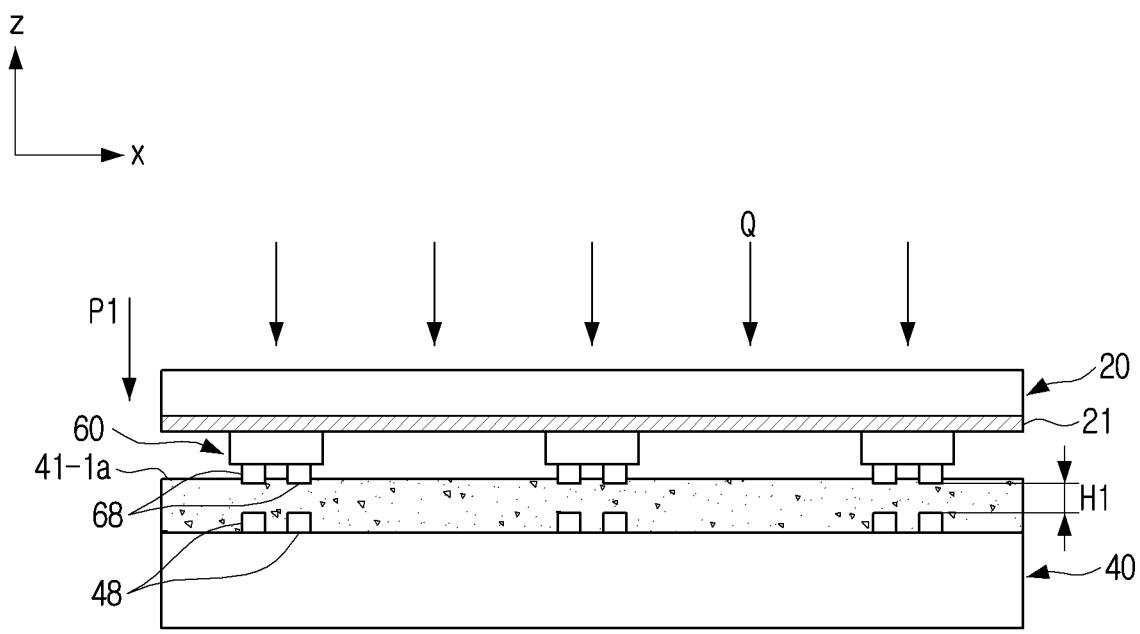
FIG. 8 is a side view illustrating a target substrate being in contact with at least one micro LED according to an embodiment.
Figure 9:
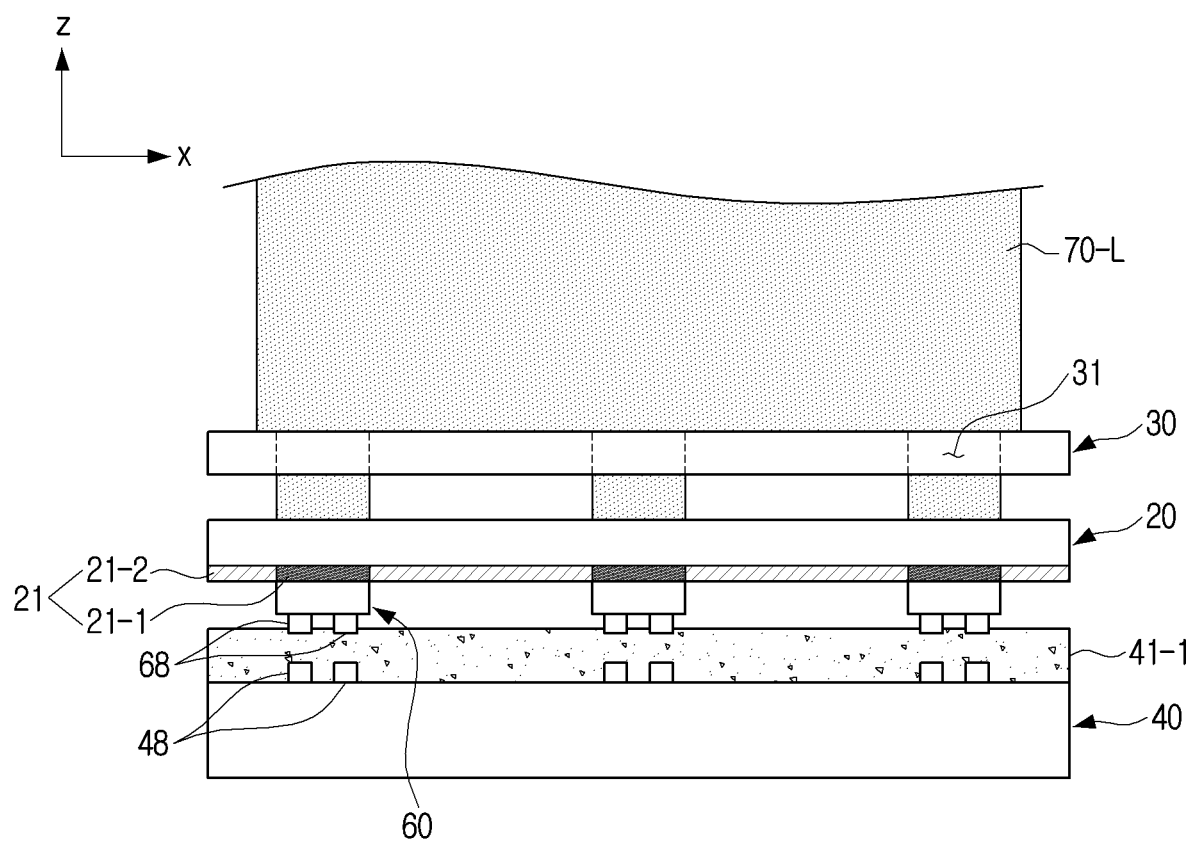
FIG. 9 is a side view illustrating a first laser light being irradiated.
Figure 10B:
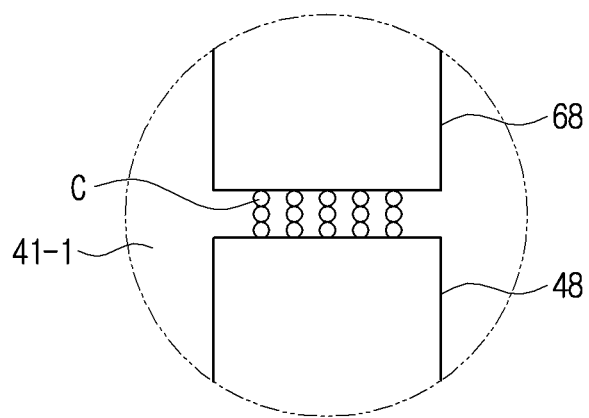
FIG. 10B is an enlarged view illustrating an area E of FIG. 10A.
Figure 11A:
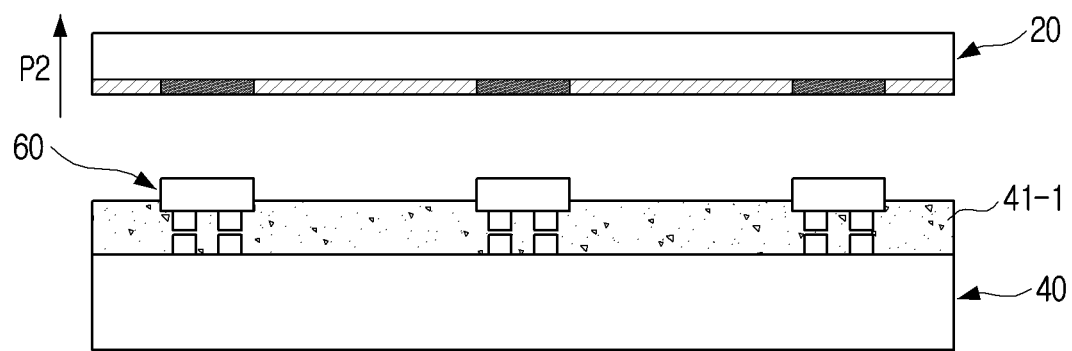
FIG. 11A is a side view illustrating a target substrate and a relay substrate separating according to an embodiment.
Figure 11B:
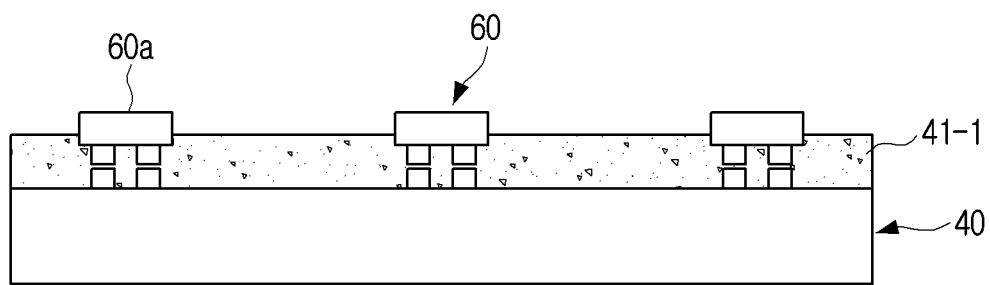
FIG. 11B is a side view illustrating a target substrate with at least one micro LED being irradiated according to an embodiment.

FIG. 6 is a side view illustrating a target substrate 40 according to an embodiment, FIG. 7 is a side view illustrating a relay substrate 20 arranged on a target substrate 40 according to an embodiment, FIG. 8 is a side view illustrating a target substrate 40 being in contact with at least one micro LED 60 according to an embodiment, FIG. 9 is a side view illustrating a first laser light 70-L being irradiated to FIG. 8, FIG. 10A is a side view illustrating a second laser light 80-L being irradiated after the step illustrated in FIG. 9, FIG. 10B is an enlarged view illustrating an area E of FIG. 10A, FIG. 11A is a side view illustrating a target substrate 40 and a relay substrate 20 separating according to an embodiment, and FIG. 11B is a side view illustrating a target substrate 40 with at least one micro LED 60 being irradiated according to an embodiment.

As illustrated in FIG. 6, the target substrate 40 may include a coupling layer 41-1 formed to cover a plurality of connection pads 48 formed at a predetermined position on the target substrate 40 and the upper surface 40a of the target substrate 40 and a plurality of connection pads 48 on the target substrate 40.

The plurality of connection pads 48 may be electrically connected to the plurality of electrode pads 68 formed on each of the at least one micro LED 60, and may transfer a driving signal of the target substrate 40 to the micro LED connected to the plurality of connection pads 48.

Specifically, the plurality of connection pads 48 may be connected to a thin film transistor arranged within the target substrate 40, and may transmit an electric signal transferred from the thin film transistor to the one micro LED.

The number and shape of the plurality of connection pads 48 may be varied according to necessity.

The coupling layer 41-1 may be formed on the upper surface 40a of the target substrate 40, and may cover the distance between the plurality of connection pads 48 and the upper surface 40a of the target substrate 40.

The coupling layer 41-1 may react directly or indirectly to a second laser light 80-L having a second wavelength and may change in viscosity. Accordingly, the coupling layer 41-1, based on a part of the viscosity changing through irradiating the second laser light 80-L, may be arranged for the at least one micro LED 60 to be adjacent to the plurality of connection pads 48. That is, the viscosity of a part of the area of the coupling layer 41-1 may be changed.

Further, the coupling layer 41-1 may cover a side surface 60c, an example of which may be illustrated in FIG. 10a, of the at least one micro LED 60 based on the at least one micro LED 60 being irradiated on the target substrate 40.

That is, based on the at least one micro LED 60 being bonded to the target substrate, the coupling layer 41-1 may cover the side surface 60c of the at least one micro LED 60.

Accordingly, the coupling layer 41-1 may stably fix the at least one micro LED 60 on the target substrate 40. Therefore, even if external shock is applied to the target substrate irradiated with at least one micro LED 60, the coupling layer 41-1 may prevent the at least one micro LED 60 from separating with the target substrate 40.

In addition, the coupling layer 41-1 may include a non-conductive material. Accordingly, the coupling layer 41-1 may be arranged between the plurality of connection pads 48, and may prevent current flowing between the plurality of connection pads 48.

Further, the coupling layer 41-1 may be arranged between the plurality of electrode pads 68 and may prevent currently flowing between the plurality of connection pads 48.

Therefore, considering that the micro LED 60 is fine scaled, the coupling layer 41-1 may prevent electrical shorts from occurring between the plurality of connection pads 48 and the plurality of connection pads 48 arranged in fine distance. Accordingly, the micro LED 60 and the target substrate 40 may be prevented from electrical damage.

In addition, the coupling layer 41-1 may include a conductive particle C to a polymer layer. That is, the coupling layer 41-1 may be formed with a material of a polymer material containing the conductive particle C of a nano or micro unit.

For example, the coupling layer 41-1 may be anisotropic conductive film (ACF) or an anistropic conductive paste (ACP). The conductive particle C may be, for example, Ni, carbon or solder ball.

The ACF may be an anisotropic conductive film in which a fine conductive particle C is mixed in an adhesive resin to produce as a film and may be electrically connected only in one direction. Further, the ACP may be an anisotropic conductive paste in which a fine conductive particle C is mixed in an adhesive resin and electricity is flowed in only one direction while maintaining adhesive property.

Accordingly, the coupling layer 41-1 may, while simultaneously forming insulation between the plurality of connection pads 48 and the plurality of electrode pads 68, electrically connect the plurality of connection pads 48 and the plurality of electrode pads 68 facing each other through the conductive particle C.

As illustrated in FIG. 7, the relay substrate 20 may then be transferred for the relay substrate 20 to align at the upper part of the target substrate 40. Specifically, the relay substrate 20 may be aligned at the upper part of the target substrate 40 for the plurality of electrode pads 68 formed on each of the at least one micro LED 60 and the plurality of connection pads 48 formed on the target substrate 40 to face each other.

That is, the processor 100 may control the transfer part 10 for the plurality of electrode pads 68 and the plurality of connection pads 48 formed on each of the at least one micro LED 60 to face each other.

The at least one micro LED 60 adhered to the relay substrate 20 may be adhered to the relay substrate 20 for the output characteristic between the plurality of areas of the relay substrate 20 to be uniform based on characteristic information of the at least one micro LED 60.

Further, the processor 100 may control the transfer part 10 for the relay substrate to align at the upper part of the target substrate 40.

Accordingly, based on the relay substrate 20 moving only vertically in a P1 direction, the plurality of connection pads 48 and the plurality of electrode pads 68 may be electrically connected.

As illustrated in FIG. 8, the relay substrate 20 may then move toward a P1 direction based on the relay substrate 20 being aligned on the target substrate 40.

The relay substrate 20 may be moved until the at least one micro LED 60 is in contact with the coupling layer 41-1 of the target substrate 40. That is, the at least one micro LED arranged at the relay substrate 20 may be in contact with the coupling layer 41-1 formed on the target substrate 40.

Specifically, the relay substrate 20 may be moved toward the target substrate 40 until the plurality of electrode pads 68 formed on each of the at least one micro LED 60 contacts the upper surface 41-1a of the coupling layer 41-1.

Further, the relay substrate 20 may be moved until the distance between the plurality of electrode pads 68 of the at least one micro LED 60 and the plurality of connection pads 48 of the target substrate 40 reaches a first height H1.

In addition, the relay substrate 20 may be continuously pressed for the distance between the plurality of electrode pads 68 of the at least one micro LED 60 and the plurality of connection pads 48 of the target substrate 40 to maintain a first height H1. That is, uniform pressing throughout the front surface of the relay substrate 20 and pressing toward the same Q direction may be made.

That is, the processor 100 may control the transfer part 10 for the at least one micro LED 60 to continuously press the coupling layer 41-1, while the first laser light 70-L and the second laser light 80-L are being irradiated toward the at least one micro LED 60.

The first height H1 may refer to being partially inserted into the coupling layer 41-1 in addition to the at least one micro LED 60 being in contact with the upper surface 41-1a of the coupling layer 41-1.

Accordingly, based on the second laser light 80-L being irradiated as the relay substrate 20 is being pressed toward the target substrate 40 for the distance between the plurality of electrode pads 68 of the at least one micro LED 60 and the plurality of connection pads 48 of the target substrate to maintain a first height H1, the heat of the second laser light 80-L may be transferred more to the coupling layer 41-1 through a structure which a part of the at least one micro LED 60 is inserted into the coupling layer 41-1.

That is, the heat transfer efficiency of the second laser light 80-L may be improved by increasing the contact surface of the at least one micro LED 60 and the coupling layer 41-1.

Further, based on the second laser light 80-L being irradiated as the relay substrate 20 is being pressed toward the target substrate 40 for the distance between the plurality of electrode pads 68 of the at least one micro LED 60 and the plurality of connection pads 48 of the target substrate to maintain a first height H1, the at least one micro LED 60 in a pressed state may move adjacent to the target substrate 40 without swaying or moving in the left and right directions (X-axis direction).

Accordingly, considering that the micro LED 60 may be fine sized, a stable alignment of the fine sized plurality of connection pads 48 and the fine sized plurality of electrode pads 68 may be realized.

As illustrated in FIG. 9, the mask 30 may then be arranged on the relay substrate 20 based on the relay substrate 20 and the target substrate 40 in alignment. Specifically, the mask 30 may be aligned with the relay substrate 20 for the plurality of openings 31 of the mask 30 to correspond with the positions arranged with the at least one micro LED 60 arranged on the relay substrate 20.

The first laser light 70-L may then be irradiated toward the at least one micro LED 60 through the mask 30 formed with the plurality of openings 31 based on the at least one m Accordingly, the irradiation area 21-1 irradiated with the first laser light 70-L of the first wavelength of the adhesive layer 21 may lose adhesive property, and the micro LED 60 adhered to the irradiation area 21-1 may separate from the relay substrate 20.

That is, based on irradiating the first laser light 70-L toward the at least one micro LED 60 arranged on the relay substrate 20, the micro LED 60 positioned at the area 21-1 irradiated with the first laser light 70-L of the adhesive layer 21 arranged between the relay substrate 20 and the at least one micro LED 60 may be separated from the adhesive layer 21.

The adhesive layer 21 may be consist of material that loses adhesive property by the first laser light 70-L of the first wavelength.

Accordingly, based on irradiating the first laser light 70-L as the at least one micro LED 60 is in contact with the coupling layer 41-1, even if the at least one micro LED 60 is separated from the adhesive layer 21, the at least one micro LED 60 may maintain an aligned position with the plurality of connection pads 48.

That is, in the process of the at least one micro LED 60 being separated from the relay substrate 20 and arranged on the coupling layer 41-1, since the at least one micro LED 60 is in contact and not separated from the coupling layer 41-1, the at least one micro LED 60 may move toward the left and right directions, for example and X-axis direction, at the moment the at least one micro LED 60 lifts-off toward the relay substrate 20 to prevent the distance between the micro LEDs 60 from changing.

Accordingly, no process for additional alignment of the at least one micro LED 60 may be required, and by implementing a certain brightness through a certain distance between the at least one micro LED 60, efficiency in manufacturing may be improved.

In FIG. 9, although the at least one micro LED 60 may be separated from the relay substrate 20, the relay substrate 20 continuously presses the at least one micro LED 60, and the at least one micro LED 60 being in contact with the relay substrate 20 may be maintained.

As illustrated in FIG. 10A, after the first laser light 70-L is irradiated, the second laser light 80-L may then be consecutively irradiated toward the at least one micro LED 60 though the mask 30 based on the at least one micro LED 60 and the coupling layer 41-1 being in contact.

That is, the at least one micro LED 60, which may be separated from the relay substrate 20, may irradiate a second light 80-L while maintaining contact with the coupling layer 41-1.

The second wavelength of the second laser light 80-L may be different from the first wavelength of the first laser light 70-L. For example, the first wavelength may be between 248 nm to 345 nm, and the second wavelength may be 980 nm.

Accordingly, the heat of the second laser light 80-L may be transferred to the coupling layer 41-1 in contact with the at least one micro LED 60 through the at least one micro LED 60, and the viscosity of the area on the coupling layer 41-1 having received the heat of the second laser light 80-L adjacent to the at least one micro LED 60 may change due to the heat of the second laser light 80-L.

Because the relay substrate 20 may be continuously pressed toward a P1 direction toward the target substrate 40, the at least one micro LED 60 may maintain being in contact with the coupling layer 41-1.

Accordingly, based on the coupling layer 41-1 of the area adjacent with the at least one micro LED 60 being melted, the at least one micro LED 60 may be moved adjacent to the plurality of connection pads 48 of the target substrate 40.

Specifically, the distance between the plurality of electrode pads 68 of the at least one micro LED 60 and the plurality of the connection pads 48 of the target substrate 40 may be a second height H2, which is shorter than the first height H1.

A part of the side surface 60c of the at least one micro LED 60 may be covered by the coupling layer 41-1. Accordingly, the at least one micro LED 60 may be more stably fixed on the target substrate 40 by the coupling layer 41-1.

Further, the at least one micro LED 60 may be electrically connected to the target substrate 40. Specifically, as illustrated in FIG. 10B, the plurality of electrode pads 68 of the at least one micro LED 60 and the plurality of connection pads 48 of the target substrate 40 may be electrically connected through the conductive particle C of the coupling layer 41-1.

The coupling layer 41-1, however, is not limited to covering the side surface 60C of the at least one micro LED 60, and the coupling layer 41-1 may only cover the plurality of electrode pads 68 of the at least one micro LED 60.

The second height H2 may refer to a height at which the plurality of electrode pads 68 of the at least one micro LED 60 and the plurality of connection pads 48 of the target substrate 40 may be electrically connected through the conductive particle C.

Further, based on the first laser light 70-L and the second laser light 80-L being irradiated toward the at least one micro LED 60, the at least one micro LED 60 may continuously press the coupling layer 41-1.

That is, the relay substrate 20 may use the at least one micro LED 60 as a pressing means.

Accordingly, the at least one micro LED 60 may be pressed adjacent to the target substrate 40 at the position separated from the relay substrate and may be fixed on the target substrate 40.

Accordingly, after separating the at least one micro LED 60 through the first laser light 70-L, since the first laser light 70-L and the second laser light 80-L is applied while continuously pressing the at least one micro LED 60 toward the target substrate 40 and not separating the second laser light 80-L and pressing process, the transfer process may be simplified.

Further, through the simplified transfer process, tolerances generated in the production process may be reduced.

For example, even if the at least one micro LED 60 is separated from the relay substrate 20 through the first laser light 70-L, the position of the at least one micro LED 60 on the coupling layer 41-1 may be stably maintained.

In addition, the position of the at least one micro LED 60 on the target substrate 40 may be stably maintained by continuously pressing the at least one micro LED 60 at the position in which the at least one micro LED is separated from the relay substrate 20 through the first laser light 70-L and irradiating the second laser light 80-L simultaneously.

Further, based on continuously pressing the at least one micro LED 60 during the transfer process, a separate micro LED pressing process may be reduced.

As illustrated in FIG. 11A, the relay substrate 20 that is separated with the at least one micro LED 60 may then be removed after the at least one micro LED 60 is stably fixed on the target substrate 40.

The coupling layer 41-1, in which the viscosity of a part of the area is changed by the second laser light 80-L, may then be in a coagulated state. In an embodiment, the viscosity may return to a similar viscosity as before the second laser light 80-L was applied.

Accordingly, as illustrated in FIG. 11B, the at least one micro LED 60 may be stably transferred on the target substrate 40 with the each of the top surface 60a exposed.

An example of an irradiation process of a micro LED according to another embodiment will be described in greater detail below with reference to FIGS. 12 to 16B.

Figure 12:
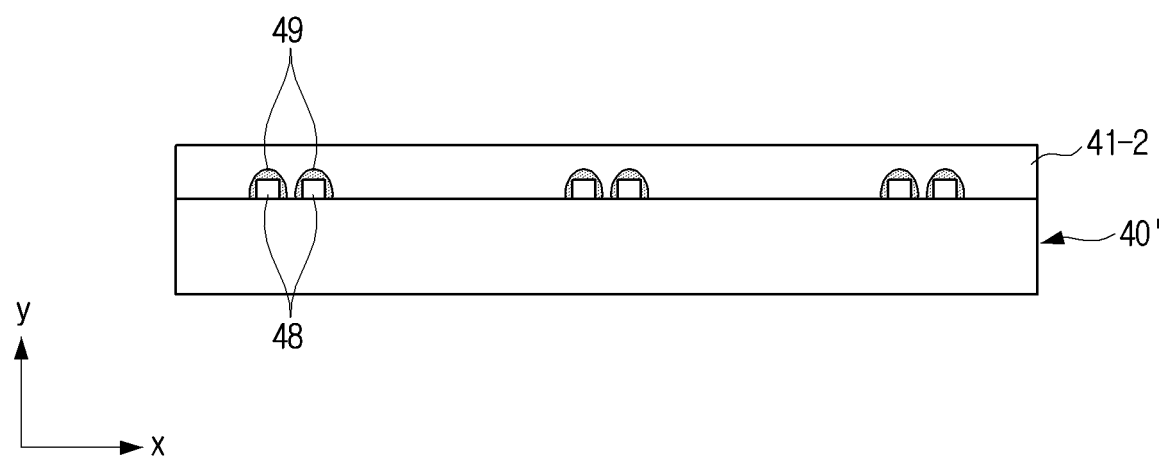
FIG. 12 is a side view illustrating a target substrate according to another embodiment.
Figure 13:
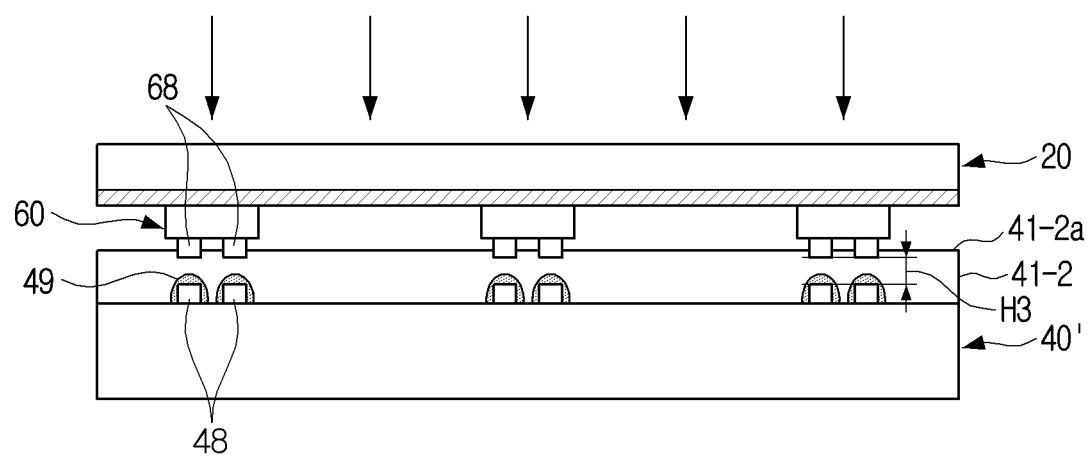
FIG. 13 is a side view illustrating a target substrate being in contact with at least one micro LED according to another embodiment.
Figure 14:
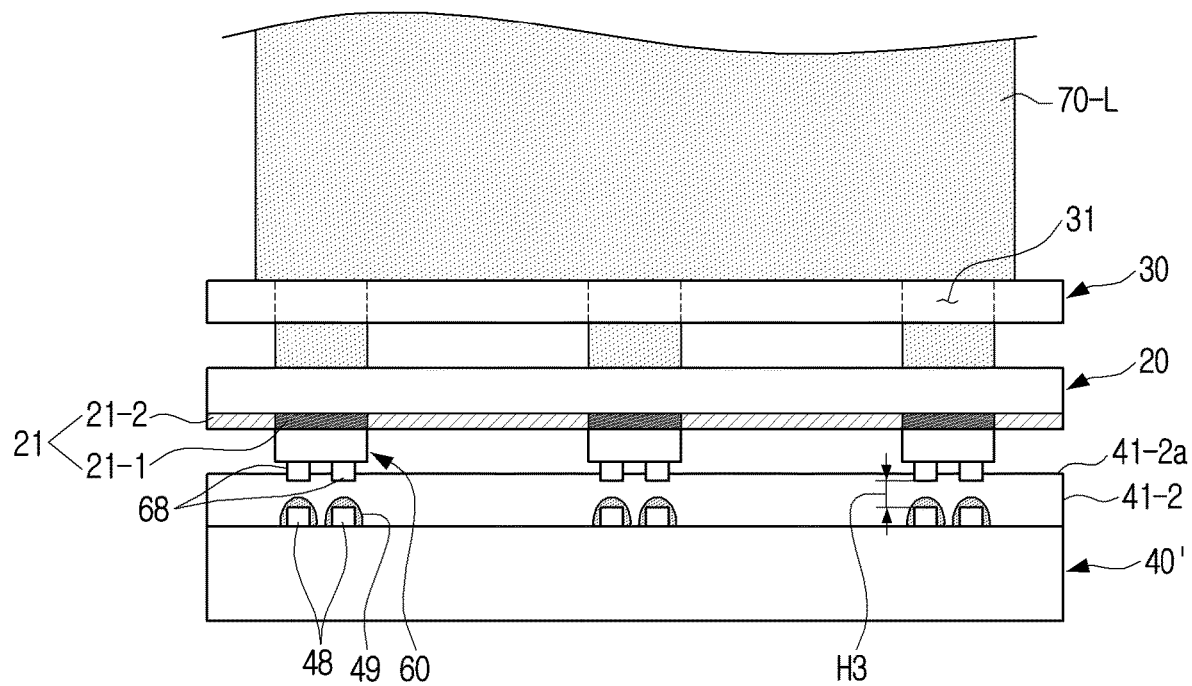
FIG. 14 is a side view illustrating a first laser light being irradiated.
Figure 15:
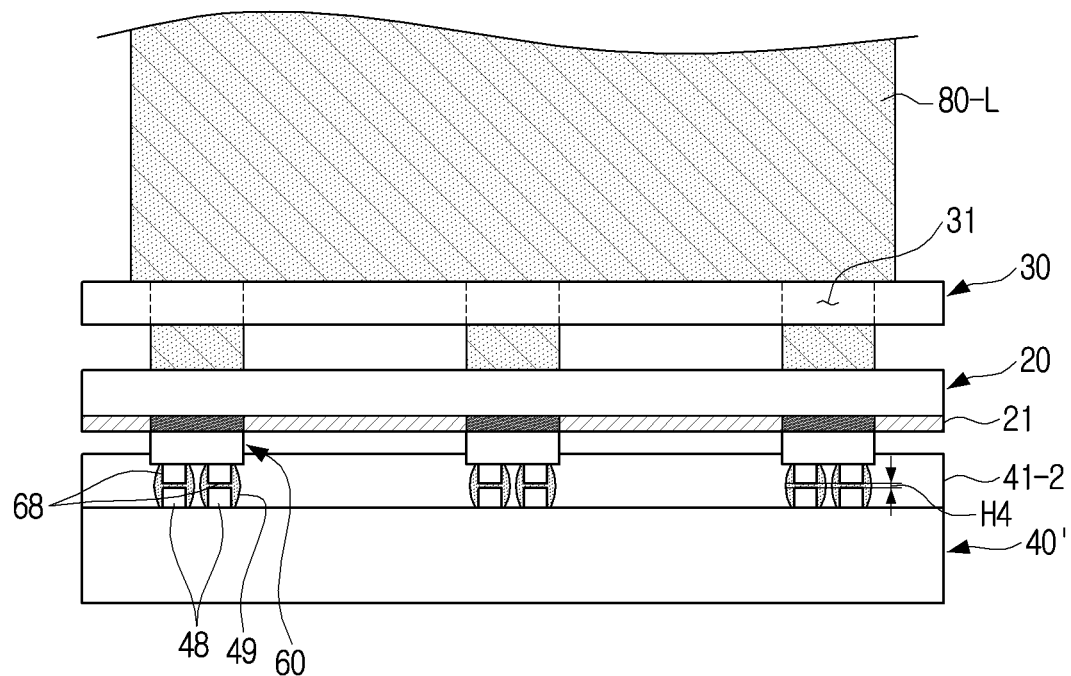
FIG. 15 is a side view illustrating a second laser light being irradiated.
Figure 16:
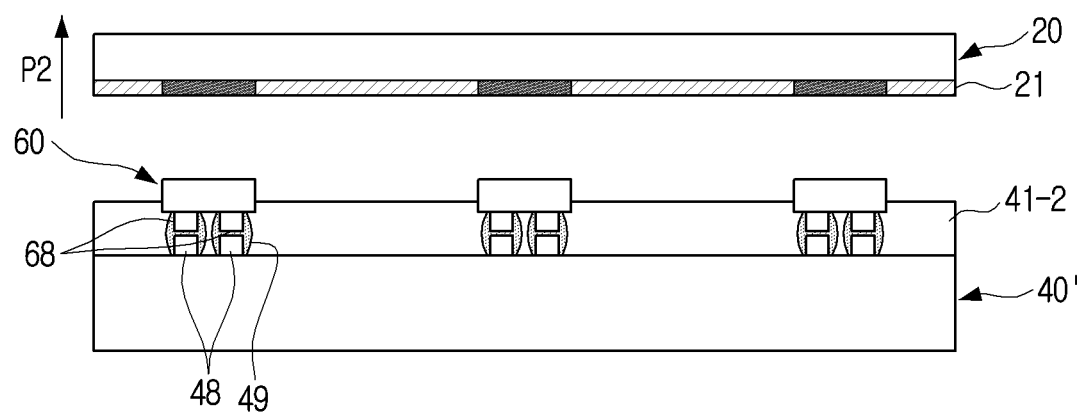
FIG. 16 is a side view illustrating a target substrate and a relay substrate separating according to another embodiment.
Figure 17:
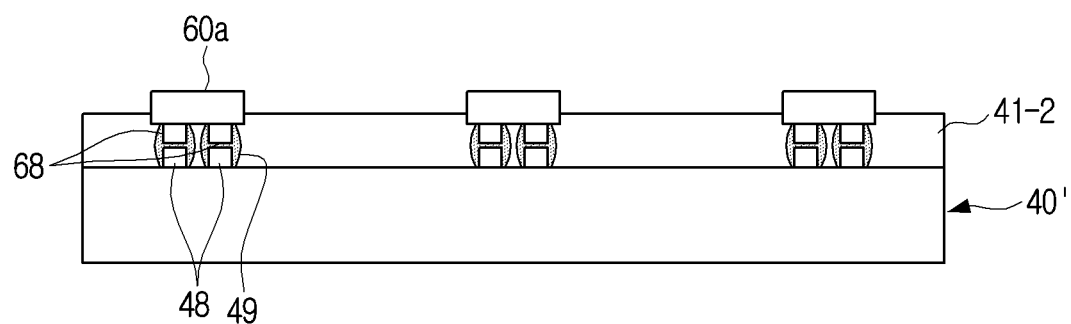
FIG. 17 is a side view illustrating a target substrate with at least one micro LED being irradiated according to another embodiment.

FIG. 12 is a side view illustrating a target substrate 40' according to another embodiment, FIG. 13 is a side view illustrating a target substrate 40' being in contact with at least one micro LED 60 according to another embodiment, FIG. 14 is a side view illustrating a first laser light 70-L being irradiated to FIG. 13, FIG. 15 is a side view illustrating a second laser light 80-L being irradiated after the step illustrated in FIG. 14, FIG. 16 is a side view illustrating a target substrate 40' and a relay substrate 20 separating according to another embodiment, and FIG. 17 is a side view illustrating a target substrate 40' with at least one micro LED 60 being irradiated according to another embodiment.

The same reference numerals have been used for the relay substrate 20, the adhesive layer 21, the mask 30, the at least one micro LED 60, the plurality of connection pads 48, the plurality of electrode pads 68, which are of the same configuration, and repetitive descriptions thereof have been omitted.

As illustrated in FIG. 12, the target substrate 40' may include a solder paste 49 formed on each of the plurality of connection pads 48 and the target substrate 40', the plurality of connection pads 48 and the coupling layer 41-2 formed on the target substrate 40' to cover the solder paste.

The solder paste may consist of a conductive material, and may be used in metal bonding. For example, the metal bonding may be possible through various materials such as Au—In bonding, Au—Sn bonding, Cu pillar/SnAg bump bonding, and Ni pillar/SnAg bump bonding.

Accordingly, the solder paste 49 may electrically connect the at least one micro LED 60 with the target substrate 40' while simultaneously fixing the at least one micro LED 60 on the target substrate 40'.

The coupling layer 41-2 may include a non-conductive material. For example, the coupling layer 41-2 may include polymer. For example, the coupling layer 41-2 may include epoxy resin, phenol resin, polyimide resin, polyurethane resin, melamine resin, urea resin and the like as main ingredients of resin.

Accordingly, the coupling layer 41-2 fills the distance between a plurality of solder paste 49 and prevents the solder paste 49 from being electrically connected, and prevent electrical short from occurring.

Accordingly, the coupling layer 41-2 may stably drive the micro LED 60 electrically.

In addition, the viscosity of a part of the area on the coupling layer 41-2 may change due to the heat of the second laser light 80-L of the second wavelength. Accordingly, the at least one micro LED 60 may be inserted into the coupling layer 41-2 and may be physically and electrically connected to the solder paste 49 of the target substrate 40'.

As illustrated in FIG. 13, the relay substrate 20 may then be transferred for the relay substrate 20 to be aligned on the upper part of the target substrate 40'.

Specifically, the relay substrate 20 may be aligned at the upper part of the target substrate 40 for the plurality of electrode pads 68 formed at each of the at least one micro LED 60 and the plurality of connection pads 48 formed on the target substrate 40 to face each other.

The at least one micro LED 60 adhered to the relay substrate 20 may be in an adhered state to the relay substrate 20 for the output characteristic between the plurality of areas of the relay substrate to be uniform based on the characteristic information of the at least one micro LED 60.

Accordingly, based on the relay substrate 20 moving only toward a P1 direction which is a vertical direction, the plurality of connection pads 48 and the plurality of electrode pads 68 may be electrically connected.

The relay substrate 20 may be moved until the at least one micro LED 60 contacts the coupling layer 41-2 of the target substrate 40'. That is, the at least one micro LED 60 arranged on the relay substrate 20 may be in contact with the coupling layer 41-2 formed on the target substrate 40'.

Specifically, relay substrate 20 may be moved toward the target substrate 40 until the plurality of electrode pads 68 formed on each of the at least one micro LED 60 is in contact with the upper surface 41-2a of the coupling layer 41-2.

Further, the relay substrate 20 may be moved until the distance between the plurality of electrode pads 68 of the at least one micro LED 60 and the plurality of connection pads 48 of the target substrate 40 reaches a third height H3.

In addition, the relay substrate 20 may be continuously pressed for the distance between the plurality of electrode pads 68 of the at least one micro LED 60 and the plurality of connection pads 48 of the target substrate 40 to maintain the third height H3.

The third height H3 may refer to the at least one micro LED 60 contacting the upper surface 41-2a of the coupling layer 41-2 and being partially inserted into the coupling layer 41-2.

The first laser light 70-L may then be irradiated toward the at least one micro LED 60 through the mask 30 formed with the plurality of openings 31 based on the at least one micro LED 60 being in contact with the coupling layer 41-2.

Accordingly, the irradiation area 21-1 irradiated with the first laser light of the first wavelength of the adhesive layer 21 may loses adhesive property and the micro LED 60 adhered to the irradiation area 21-1 may be separated from the relay substrate 20.

As illustrated in FIG. 15, after irradiating the first laser light 70-L, the second laser light 80-L may then be consecutively irradiated toward the at least one micro LED 60 through the mask 30 based on the at least one micro LED 60 and the coupling layer 41-2 being in contact.

That is, the at least one micro LED 60 capable of being separated with the relay substrate 20 may irradiate the second laser light 80-L while maintaining contact with the coupling layer 41-2.

Accordingly, the heat of the second laser light 80-L may be transferred to the coupling layer 41-2 in contact with the at least one micro LED 60 through the at least one micro LED 60, and the viscosity of the area on coupling layer 41-2 having received the heat of the second laser light 80-L adjacent to the at least one micro LED 60 may be changed due to the heat of the second laser light 80-L.

Further, the viscosity of the solder paste 49 of the area adjacent to the at least one micro LED 60 may change. Accordingly, the plurality of electrode pads 68 of the at least one micro LED 60 and the plurality of connection pads 48 of the target substrate 40' may be electrically and physically interconnected through the solder paste 49.

In addition, the distance between the plurality of electrode pads 68 of the at least one micro LED 60 and the plurality of connection pads 48 of the target substrate 40' may be a fourth height H4 shorter than the third height H3.

As illustrated in FIGS. 16 and 17, based on the relay substrate 20 being removed, the at least one micro LED 60 may then be transferred on the target substrate 40'.

Accordingly, a micro LED transferring method according to another embodiment may also be simplified in transfer process by separating the at least one micro LED 60 through the first laser light 70-L, and then applying the first laser light 70-L and the second laser light 80-L while continuously pressing the at least one micro LED 60 toward the target substrate 40' and not separating the second laser light 80-L and the pressing process.

An example of a micro LED transferring method according to an embodiment will be described below with reference to FIG. 18.

Figure 18:
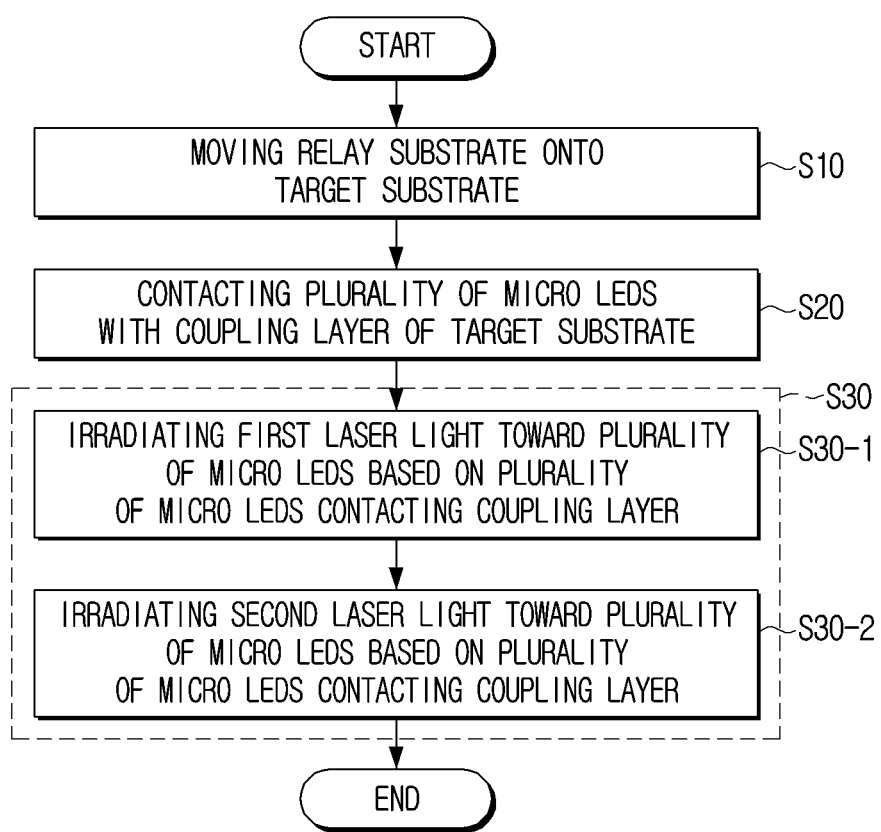
FIG. 18 is a block diagram illustrating a micro LED transferring method according to an embodiment.

FIG. 18 is a block diagram illustrating a micro LED transferring method according to an embodiment.

The micro LED transferring method according to an embodiment may include transferring the relay substrate 20 for the relay substrate 20 to align at the upper part of the target substrate 40 at operation S10.

Specifically, the transferring the relay substrate 20 may include aligning the plurality of electrode pads 68 formed at each of the at least one micro LED 60 and the plurality of connection pads 48 formed on the target substrate 40 to face each other.

The at least one micro LED 60 arranged on the relay substrate 20 may then be made to contact the coupling layers 41-1 and 41-2 formed on the target substrate 40 at operation S20.

The at least one micro LED 60 arranged at the relay substrate 20 may be arranged on the relay substrate 20 for the output characteristic between the plurality of areas of the relay substrate 20 to be uniform based on characteristic information of at least one micro LED 60.

The first laser light 70-L to separate the at least one micro LED 60 and the relay substrate 20 and the second laser light 80-L to bond the at least one micro LED 60 to the target substrate 40 may be consecutively irradiated at operation S30.

When the first laser light 70-L and the second laser light 80-L are consecutively irradiated, the at least one micro LED 60 and the coupling layers 41-1 and 41-2 may maintain contact.

That is, while the first laser light 70-L and the second laser light 80-L are being irradiated toward the at least one micro LED 60, the at least one micro LED 60 may be in a state of continuously pressing the coupling layers 41-1 and 41-2.

Specifically, based on the at least one micro LED 60 and the coupling layers 41-1 and 41-2 being in contact, the first laser light 70-L may be irradiated toward the at least one micro LED 60 at operation S30-1.

Further, the first laser light 70-L may be irradiated toward the at least one micro LED 60 through the mask 30 formed with the plurality of openings 31.

Accordingly, the micro LED positioned at the area 21-1 irradiated with the first laser light 70-L of the adhesive layer 21 arranged between the relay substrate 20 and the at least one micro LED 60 may be lifted-off from the adhesive layer 21.

After irradiating the first laser light 70-L, the second laser light 80-L may then be irradiated toward the at least one micro LED 60 based on the at least one micro LED 60 and the coupling layers 41-1 and 41-2 being in contact at operation S30-2.

Specifically, based on the at least one micro LED 60 and the coupling layers 41-1 and 41-2 being in contact, the second laser light 80-L may be irradiated toward the at least one micro LED 60 at operation S30-2.

Accordingly, the plurality of electrode pads 68 of the at least one micro LED 60 and the plurality of connection pads 48 of the target substrate 40 may be electrically connected through irradiating the second laser light 80-L.

Further, the at least one micro LED 60 may be connected to the target substrate 40.

Meanwhile, the methods according to the various embodiments may be implemented in application format installable to an existing micro LED transfer device.

In addition, the methods according to the various embodiments may be implemented as a software upgrade for an existing micro LED transfer device or as a hardware upgrade.

In addition, the various embodiments described above may be performed through an embedded server provided in a micro LED transfer device or through an external server of a micro LED transfer device.

The various embodiments described above may be implemented in a computer or a recording medium capable of reading with a similar device using a software, a hardware or a combination thereof. In some cases, the embodiments described in the disclosure may be implemented by the processor 100 alone. According to a software implementation, embodiments such as the procedures and functions described herein may be implemented with separate software modules. Each of the above-described software modules may perform one or more of the functions and operations described herein.

Meanwhile, the computer instructions for performing the processing operations of the micro LED transfer device 1 according to the various embodiments described above may be stored in a non-transitory computer-readable medium. The computer instructions stored in this non-transitory computer-readable medium cause the above-described specific device to perform the processing operations in the micro LED transfer device 1 according to the above described various embodiments when executed by the processor of the specific device.

The non-transitory computer readable medium refers to a medium that stores data semi-permanently rather than storing data for a very short time, such as a register, a cache, a memory, or the like, and is readable by a device. Specific examples of the non-transitory computer-readable medium may include a compact disc (CD), a digital versatile disc (DVD), a hard disc, a Blu-ray disc, a universal serial bus (USB), a memory card, a read only memory (ROM), and the like.

While the various embodiments have been individually described, each embodiment may not necessarily be implemented singularly, and the configuration and operation described in each embodiment may be implemented in combination with at least one of the other embodiments.

In addition, although exemplary embodiments have been illustrated and described above, the disclosure is not limited to the specific embodiments described above, and it will be understood by those skilled in the art that various changes in form and details may be made therein without departing from the spirit and scope as defined by the appended claims and their equivalents.

What is claimed is:

1. A light emitting diode (LED) transfer device comprising:
    a transfer part configured to transfer a relay substrate having at least one LED arranged at a lower part of the relay substrate;
    an adhesive layer arranged between the relay substrate and the at least one LED;
    a mask arranged at an upper part of the relay substrate, and having a plurality of openings, wherein a position of the plurality of openings corresponds to a position of the at least one LED;
    a first laser configured to irradiate a first laser light having a first wavelength to the mask;
    a second laser configured to irradiate a second laser light having a second wavelength different from the first wavelength to the mask; and
    a processor configured to:
    control the transfer part to cause the at least one LED to contact an upper part of a coupling layer of a target substrate, and
    based on the coupling layer contacting the at least one LED, control the first laser to irradiate the first laser light toward the at least one LED, and subsequently control the second laser to irradiate the second laser light toward the at least one LED,
    wherein based on an area of the adhesive layer being irradiated with the first laser light, the adhesive layer is configured to separate a LED arranged on the area from among the at least one LED from the relay substrate, and
    wherein based on an area of the coupling layer being irradiated with the second laser light, the coupling layer is configured to connect the separated LED to the target substrate.

2. The LED transfer device of claim 1, wherein the target substrate comprises a plurality of connection pads formed at a plurality of predetermined positions, and
    wherein the processor is configured to control the transfer part such that a plurality of electrode pads formed on the at least one LED are positioned facing the plurality of connection pads.

3. The LED transfer device of claim 2, wherein the coupling layer comprises a polymer, and wherein a solder paste is formed on each of the plurality of connection pads.

4. The LED transfer device of claim 1, wherein the processor is configured to control the transfer part to continuously press the at least one LED into the coupling layer based on the first laser light and the second laser light being irradiated toward the at least one LED.

5. The LED transfer device of claim 1, wherein the at least one LED is arranged on the relay substrate based on a characteristic information of the at least one LED such that output characteristics of a plurality of areas on which the at least LED is to be placed are uniform.

6. The LED transfer device of claim 5, wherein the at least one LED comprises:

a first LED configured to emit a red light;
a second LED configured to emit a green light; and
a third LED configured to emit a blue light,
wherein the first LED, the second LED, and the third LED are arranged consecutively on the relay substrate.

7. The LED transfer device of claim 1, wherein the coupling layer comprises at least one from among an anisotropic conductive film (ACF) or an anisotropic conductive paste (ACP).

8. The LED transfer device of claim 1, wherein the first wavelength comprises a wavelength in an ultraviolet ray (UV) range, and the second wavelength comprises a wavelength in an infrared ray (IR) range.

9. The LED transfer device of claim 1, wherein the coupling layer is configured to cover a side surface of the at least one LED based on the at least one LED being bonded to the target substrate.

* * * * *